US008857120B2

(12) United States Patent
Marrs et al.

(10) Patent No.: US 8,857,120 B2
(45) Date of Patent: Oct. 14, 2014

(54) CEILING SUPPORTED COLD AISLE CONTAINMENT SYSTEM

(71) Applicant: Panduit Corp., Tinley Park, IL (US)

(72) Inventors: Samuel M. Marrs, Bradley, IL (US); Mark Shurhay, Western Springs, IL (US); William A. Bernard, Darien, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 13/864,448

(22) Filed: Apr. 17, 2013

(65) Prior Publication Data
US 2013/0276389 A1 Oct. 24, 2013

Related U.S. Application Data

(60) Provisional application No. 61/635,577, filed on Apr. 19, 2012.

(51) Int. Cl.
| | |
|---|---|
| *E04B 9/18* | (2006.01) |
| *E04B 2/74* | (2006.01) |
| *E04B 1/38* | (2006.01) |
| *H05K 7/20* | (2006.01) |
| *A62C 35/00* | (2006.01) |
| *E04B 2/82* | (2006.01) |
| *E04B 2/72* | (2006.01) |

(52) U.S. Cl.
CPC . *A62C 35/00* (2013.01); *E04B 2/74* (2013.01); *E04B 1/38* (2013.01); *E04B 9/18* (2013.01); *H05K 7/20745* (2013.01); *E04B 2/825* (2013.01); *E04B 2/72* (2013.01)
USPC .......... 52/506.06; 52/238.1; 52/241; 52/36.2; 312/201

(58) Field of Classification Search
CPC ............... E04B 2/74; E04B 1/38; E04B 9/18; A62C 35/00
USPC ........... 52/36.2, 36.4, 36.5, 39, 64, 79.1, 174, 52/243.1, 239, 238.1, 241, 173.1, 745.05, 52/745.09, 745.1, 745.12, 745.06, 745.13, 52/745.15, 745.16, 741.4, 281, 650.2, 52/650.3, 385, 506.01, 506.05, 506.06, 52/506.07, 506.08, 506.09, 506.1; 312/198–199, 201; 361/688–689, 692, 361/694
See application file for complete search history.

(56) References Cited

U.S. PATENT DOCUMENTS

| | | | | |
|---|---|---|---|---|
| 3,410,042 A | * | 11/1968 | Averill | 52/243.1 |
| 3,596,425 A | * | 8/1971 | Kodaras | 52/665 |
| 3,638,387 A | * | 2/1972 | Lickliter et al. | 52/745.12 |
| 3,683,100 A | * | 8/1972 | Deal et al. | 174/491 |
| 3,720,026 A | * | 3/1973 | Gasteiger | 52/241 |

(Continued)

FOREIGN PATENT DOCUMENTS

DE 102008024973 B3 * 9/2009 ............... H05K 7/20

*Primary Examiner* — Brian Glessner
*Assistant Examiner* — Beth Stephan
(74) *Attorney, Agent, or Firm* — Christopher S. Clancy; James H. Williams

(57) ABSTRACT

An aisle containment system is provided. The aisle containment system includes a pair of wall beams suspended from a ceiling, a pair of floor tracks positioned beneath the wall beams and secured to a floor, and at least one blanking panel secured to one of the wall beams and one of the floor tracks.

38 Claims, 30 Drawing Sheets

(56) References Cited

U.S. PATENT DOCUMENTS

| | | | | |
|---|---|---|---|---|
| 3,748,793 | A * | 7/1973 | Tompkins et al. | 52/64 |
| 3,861,103 | A * | 1/1975 | Rasmussen | 52/241 |
| 3,986,314 | A * | 10/1976 | Moeller | 52/241 |
| 4,081,931 | A * | 4/1978 | Miyoshi | 52/39 |
| 4,209,953 | A * | 7/1980 | Wendt | 52/241 |
| 4,245,442 | A * | 1/1981 | Durham | 52/126.4 |
| 4,263,761 | A * | 4/1981 | Kristoff | 52/241 |
| 4,277,920 | A * | 7/1981 | Dixon | 52/64 |
| 4,402,171 | A * | 9/1983 | Snyder | 52/745.05 |
| 4,462,192 | A * | 7/1984 | Fisher | 52/240 |
| 4,512,118 | A * | 4/1985 | Rasmussen | 52/39 |
| 4,535,578 | A * | 8/1985 | Gerken | 52/243.1 |
| 4,608,066 | A * | 8/1986 | Cadwell, Jr. | 55/385.1 |
| 4,667,579 | A | 5/1987 | Daw | |
| 4,754,584 | A * | 7/1988 | Newton, II | 52/106 |
| 4,905,428 | A * | 3/1990 | Sykes | 52/126.4 |
| 4,908,915 | A * | 3/1990 | Ruggles et al. | 24/336 |
| 4,986,047 | A | 1/1991 | Power | |
| 5,010,702 | A * | 4/1991 | Daw et al. | 52/241 |
| 5,228,254 | A * | 7/1993 | Honeycutt, Jr. | 52/241 |
| 5,364,053 | A * | 11/1994 | Rodgers | 248/302 |
| 5,524,402 | A * | 6/1996 | Sykes | 52/243.1 |
| 5,603,192 | A * | 2/1997 | Dickson | 52/238.1 |
| 5,644,877 | A * | 7/1997 | Wood | 52/241 |
| 5,845,454 | A * | 12/1998 | Malizia | 52/713 |
| 6,029,413 | A * | 2/2000 | Compas, Jr. | 52/506.06 |
| 6,034,873 | A | 3/2000 | Stahl et al. | |
| 6,729,096 | B1 * | 5/2004 | Ashmore et al. | 52/506.06 |
| 6,867,967 | B2 | 3/2005 | Mok | |
| 7,228,664 | B2 * | 6/2007 | Clark | 52/243.1 |
| 7,697,285 | B2 | 4/2010 | Donowho et al. | |
| 7,746,637 | B2 | 6/2010 | Donowho et al. | |
| 7,839,635 | B2 | 11/2010 | Donowho et al. | |
| 2002/0157335 | A1 * | 10/2002 | Vos | 52/238.1 |
| 2007/0064389 | A1 | 3/2007 | Lewis, II et al. | |
| 2010/0144265 | A1 | 6/2010 | Bednarcik et al. | |
| 2011/0148261 | A1 | 6/2011 | Donowho et al. | |
| 2011/0175505 | A1 | 7/2011 | Linhares, Jr. et al. | |
| 2011/0232219 | A1 * | 9/2011 | Wilkinson et al. | 52/474 |
| 2011/0271610 | A1 | 11/2011 | Cottuli et al. | |
| 2011/0278998 | A1 | 11/2011 | Caveney et al. | 312/109 |
| 2011/0299242 | A1 * | 12/2011 | Grantham et al. | 361/688 |

* cited by examiner

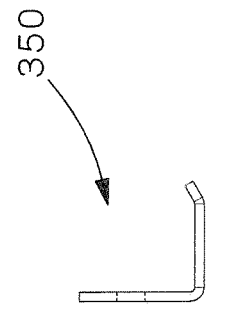
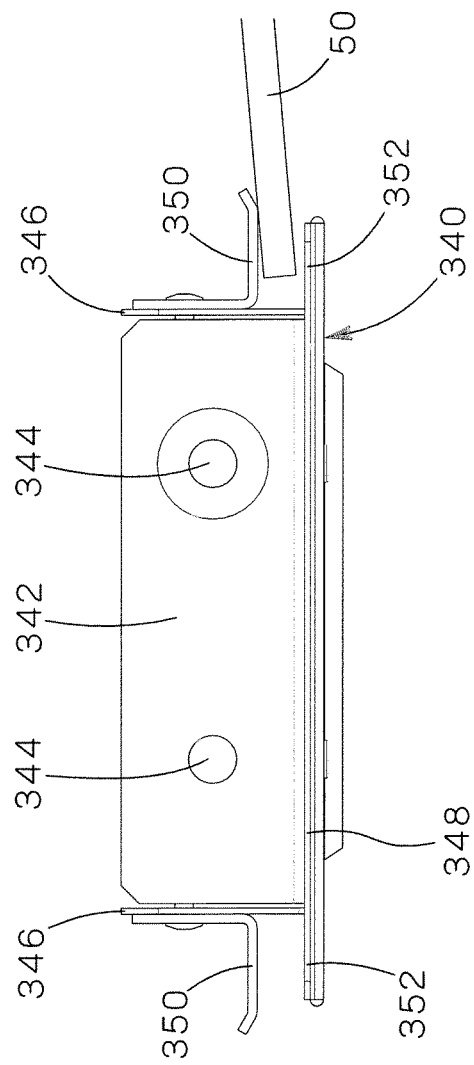
FIG.12B
FIG.12A

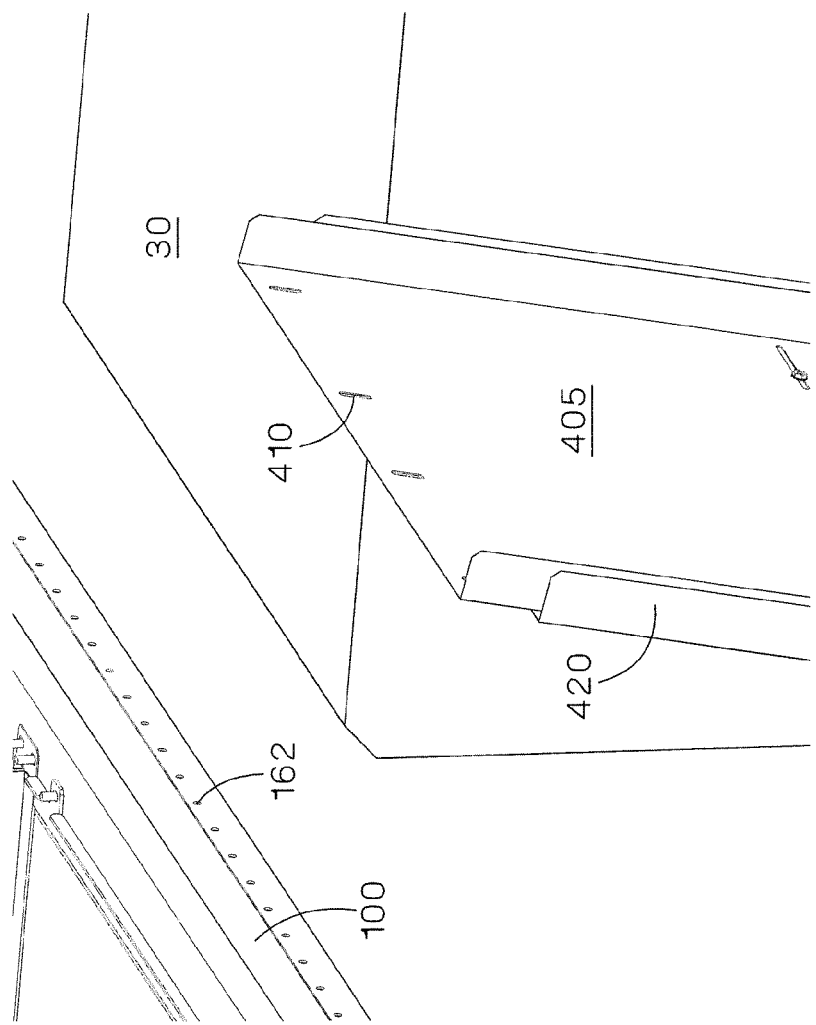

CEILING SUPPORTED COLD AISLE CONTAINMENT SYSTEM

CROSS REFERENCE TO RELATED APPLICATION

This application claims the benefit of U.S. Provisional Patent Application No. 61/635,577, filed Apr. 19, 2012 and is incorporated by reference in its entirety.

FIELD OF INVENTION

This invention relates to aisle containment systems and, more particularly, to scalable and adjustable ceiling supported cold aisle containment systems.

BACKGROUND

There is a need for cold aisle containment systems where the basic structure of the system is easily installed prior to the majority of cabinets being in place. It would also be beneficial to have a containment system that is adjustable to take into account the future installation of cabinets of varying sizes and where cabinets can be easily added or removed without major reconfiguration of the structure. It would also be beneficial if the cold aisle containment system could be secured to the structure of a typical drop ceiling to aid in the ease of installation.

SUMMARY

The present invention relates generally to a ceiling supported cold aisle containment system.

In one embodiment, a cold aisle containment system comprises a plurality of floor tracks secured to a raised floor grid and a plurality of wall beams positioned above the floor tracks and supported from the structure of a drop ceiling. Blanking panels are disposed side by side, extend between the floor tracks and the wall beams, and are secured to the floor tracks and wall beams. A ceiling tile support system extends between the wall beams and supports a plurality of ceiling tiles.

In another embodiment, the blanking panels of the cold aisle containment system comprises fixed blanking panels and adjustable blanking panels.

In another embodiment, the ceiling tile support system of the cold aisle containment system comprises a plurality of tee beams extending between and perpendicular to the wall beams and a plurality of center beams extending between and perpendicular to the tee beams.

In another embodiment, the cold aisle containment system further comprises a plurality of corner cabinets positioned at the ends of the containment system and end of row doors, which are supported by the corner cabinets and positioned at the ends of the containment system.

In another embodiment, the cold aisle containment system further comprises a plurality of above cabinet blanking panels. Each above cabinet blanking panel has an upper panel that is securable to the wall beams and a lower panel that is vertically adjustable to seal against a corresponding cabinet.

In another embodiment, a method of installing a cold aisle containment system comprises the steps of: securing a plurality of floor tracks to a raised floor tile grid; positioning a plurality of wall beams above the floor tracks and supporting the wall beams from the structure of a drop ceiling; securing a plurality of tee beams between the wall beams; positioning a plurality of center beams between the tee beams; positioning a plurality of ceiling tiles between the wall beams, tee beams, and center beams; and securing a plurality of blanking panels side by side between the floor tracks and the wall beams.

BRIEF DESCRIPTION OF THE DRAWINGS

Certain embodiments of the present invention are illustrated by the accompanying figures. It should be understood that the figures are not necessarily to scale and that details that are not necessary for an understanding of the invention or that render other details difficult to perceive may be omitted. It should be understood, of course, that the invention is not necessarily limited to the particular embodiments illustrated herein.

FIG. 4A is an enlarged partial view of a floor track shown in FIG. 4;

FIG. 12A is an enlarged partial view of the tee beam with retention bracket of FIG. 12;

FIG. 12B is a front view of an L-shaped retention bracket;

FIG. 14B is an enlarged partial view of the top of the adjustable blanking panel in FIG. 14;

DETAILED DESCRIPTION

Figure 1:
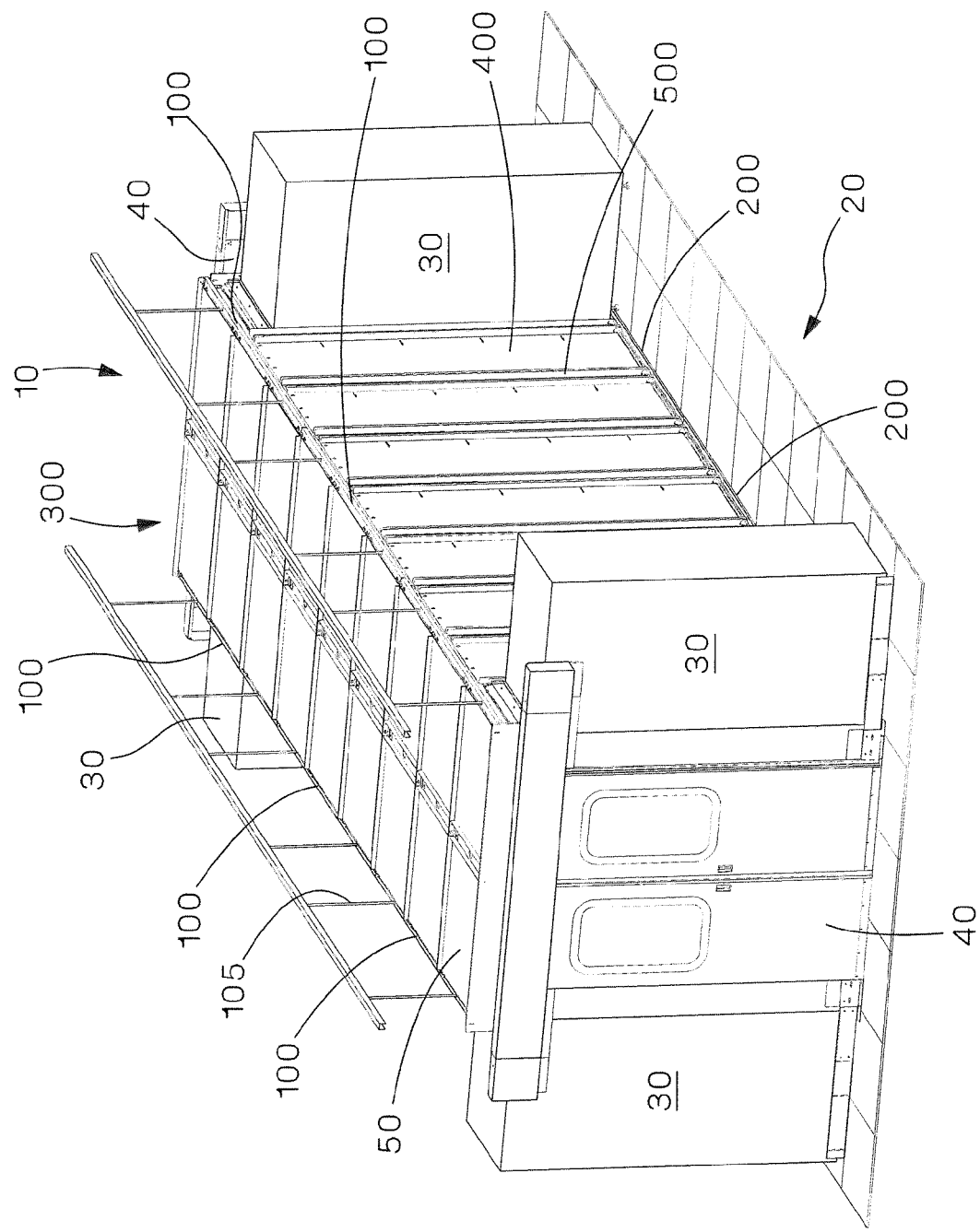
FIG. 1 is a front perspective view of an exemplary cold aisle containment system with corner cabinets and end of row doors.

Referring to FIG. 1, one embodiment of a cold aisle containment system 10 is shown installed on a raised floor tile grid 20 with four corner cabinets 30 and end of row doors 40. The cold aisle containment system 10 allows the basic structure to be erected prior to the majority of the cabinets being in place, allows cabinets to be easily added or removed from the cold aisle containment system 10 without major reconfiguration of the structure, and accepts a wide variety of makes and sizes of cabinets, which is particularly advantageous for pre-configured systems that incorporate computer and storage cabinets of varying widths and heights. Although the embodiments shown and described herein are for a cold aisle containment system, the same structure and arrangement could also be used for a hot aisle containment system or any other type of aisle containment system desired.

The cold aisle containment system 10 shown in FIG. 1 generally comprises a series of wall beams 100, a series of floor tracks 200, a ceiling tile support system 300, and a series of blanking panels 400, 500. Wall beams 100 attach to threaded rods 105 that hang from a data center's ceiling grid system and define the upper limit of the containment system 10. The floor tracks 200 are positioned directly below the wall beams 100 and run the entire length of the containment system 10. The blanking panels 400, 500 are positioned between and secured to the wall beams 100 and floor tracks 200, define the containment area, and seal off areas where future cabinets can be installed. At each corner of the containment system 10 are corner cabinets 30, which are positioned to support end of row doors 40.

Figure 2:
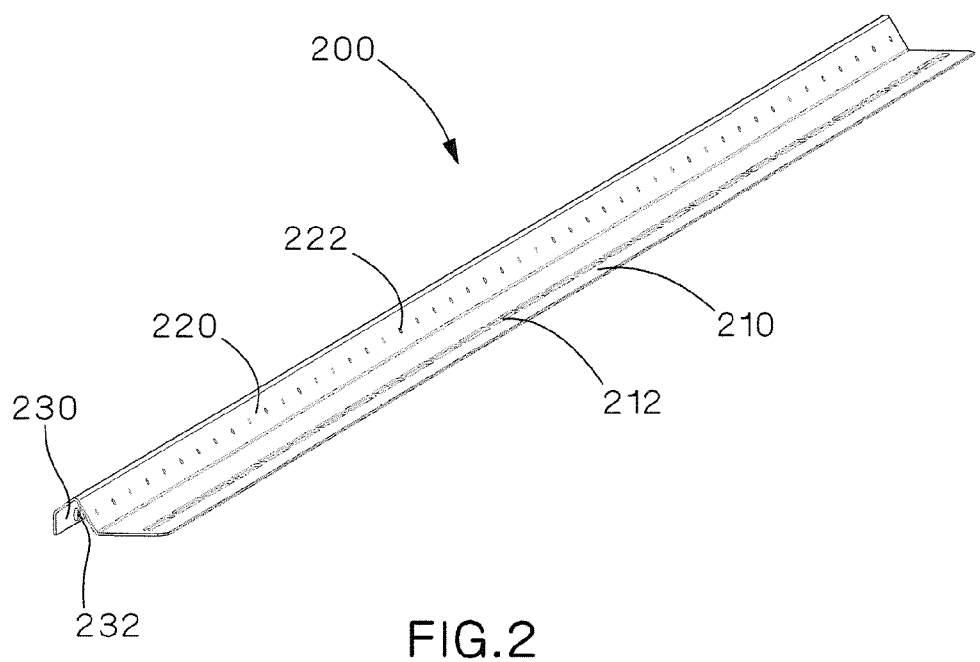
FIG. 2 is a rear perspective view of an exemplary floor track of the cold aisle containment system.
Figure 3:
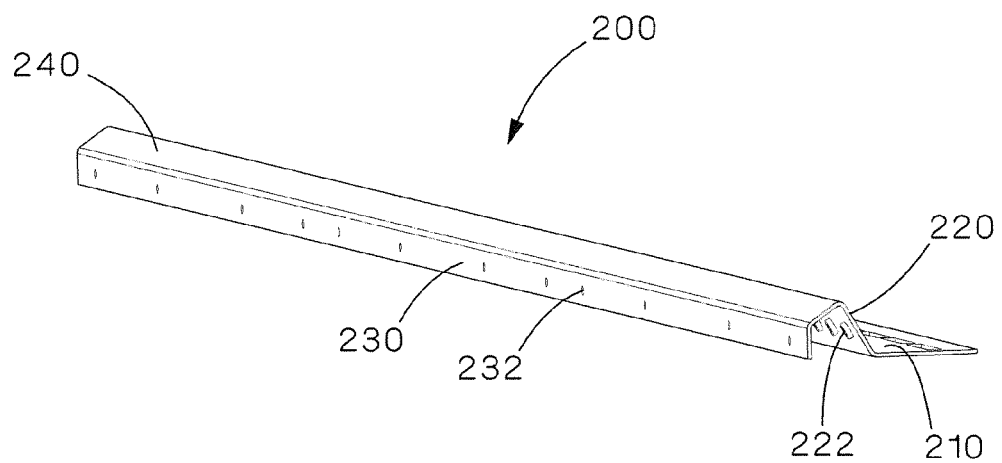
FIG. 3 is a front perspective view of the floor track of FIG. 2.

Referring to FIGS. 2 and 3, the floor tracks 200 are used to support and position the cabinet blanking panels 400, 500 and any cabinets that are installed in the containment system 10. FIG. 2 is a view looking at the back (cabinet side) of a floor track 200 and FIG. 3 is a view looking at the front (contained area side) of a floor track 200. Each floor track 200 is formed from a metal sheet, or other appropriate material, and generally defines a base plate 210, back wall 220 extending from the base plate 210, front wall 230, and connecting wall 240 extending between the back wall 220 and front wall 230. A series of slots 212 are formed longitudinally along and through base plate 210 and are used to secure the base plate 210 to the raised floor tile grid 20 with screws or other fasteners. Slots 212 are formed along the entire length of base plate 210, which allows the placement of the screws anywhere along the length of base plate 210 to allow easy positioning and alignment of floor track 200.

Threaded holes 222 are formed along the length of back wall 220 and allow the blanking panels 400, 500 to be fastened to the floor track 200 for better stability. Holes 232 are also formed in front wall 230 and allow a seal to be attached, which is discussed in more detail below. The profile shape of back wall 220, front wall 230, and connecting wall 240 mimics the bottom profile shape of base members 440, 520 of the blanking panels 400, 500 (see FIG. 16). This allows floor track 200 and blanking panels 400, 500 to nest together n a secure fashion.

Figure 4:
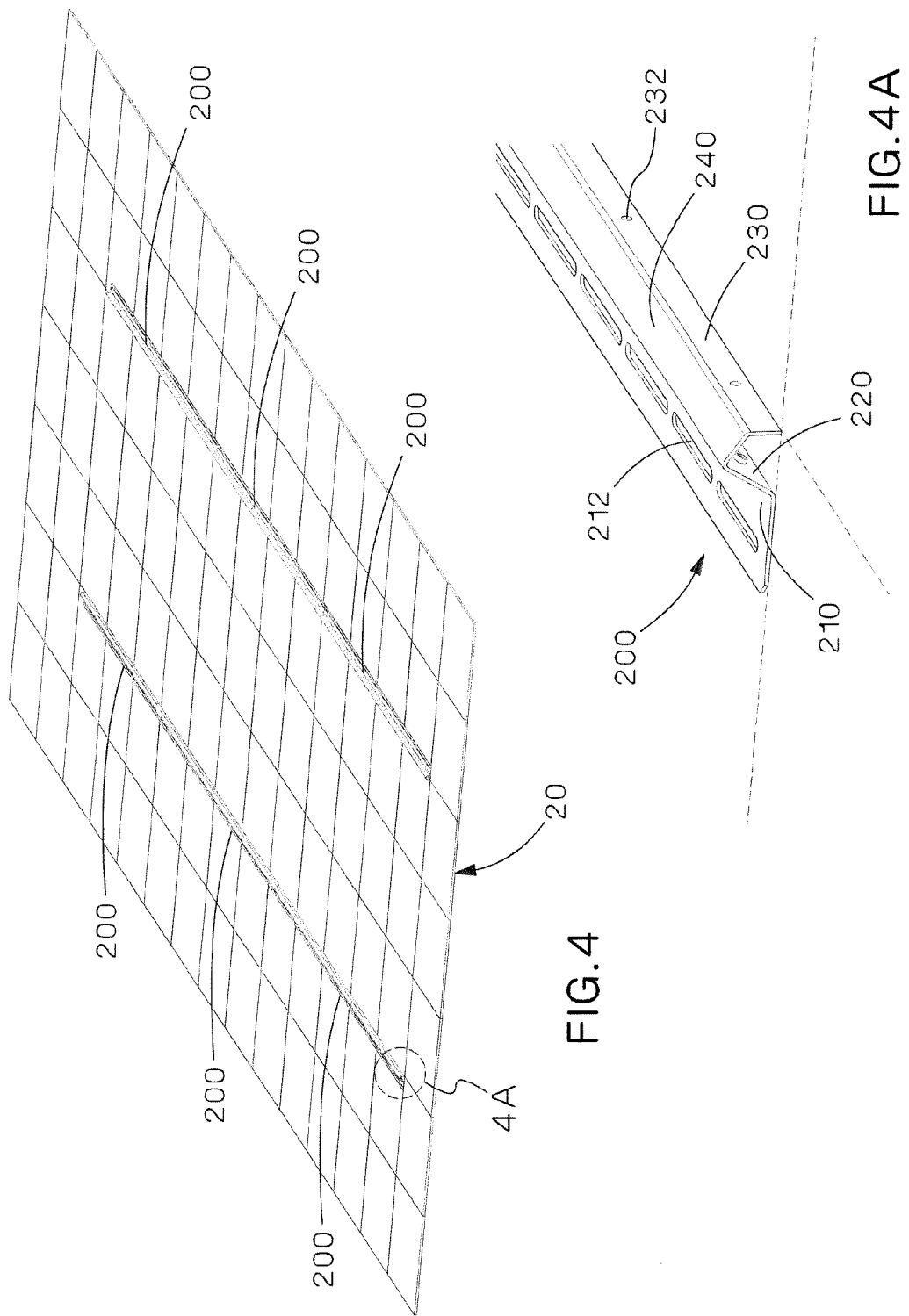
FIG. 4 is a perspective view of a series of exemplary floor tracks installed on a raised floor tile grid.

Referring to FIG. 4, to install containment system 10, multiple floor tracks 200 are positioned on a raised floor tile grid 20, to form a base for the containment system 10, and secured with screws (not shown) through slots 212. Several floor tracks 200 are laid end to end, and a second set of floor tracks 200 are positioned parallel to the first, to define the containment system 10 width and define the edges of the containment perimeter. The length of each parallel track is determined by the desired size of containment system 10 being installed. As shown in FIG. 4A, in an exemplary installation, the front walls 230 of floor tracks 200 are positioned so that they run along the floor tile edges. This makes floor track 200 placement well defined and simple for an installer and also allows the individual floor tiles located within the containment system 10 to be removed if under floor access is needed.

Figure 5:
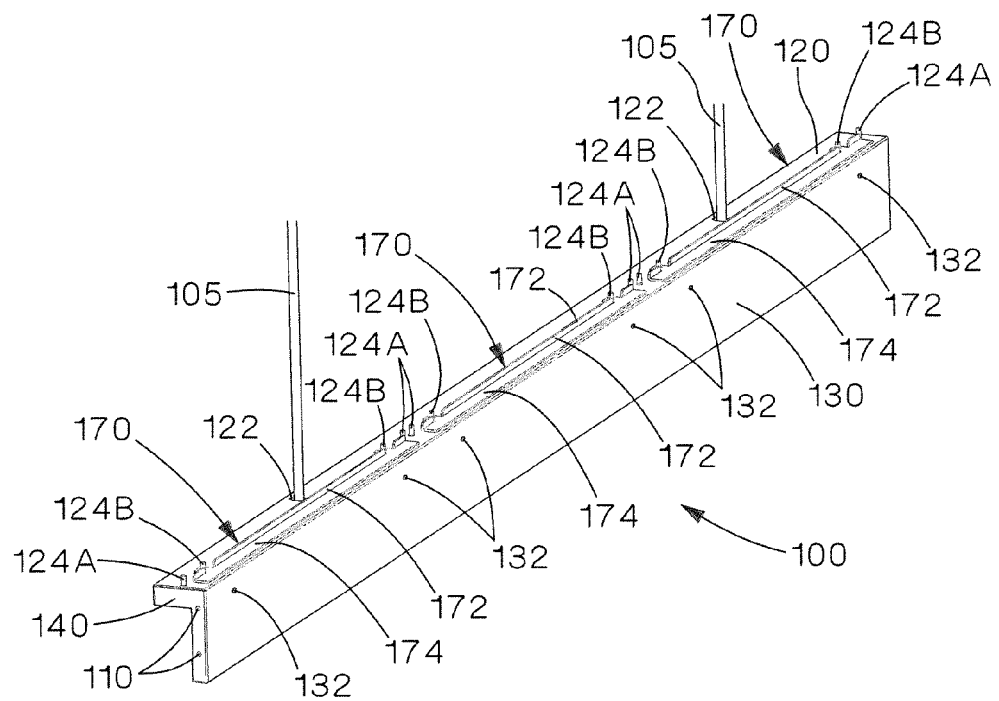
FIG. 5 is a front perspective view of an exemplary wall beam of the cold aisle containment system.
Figure 6:
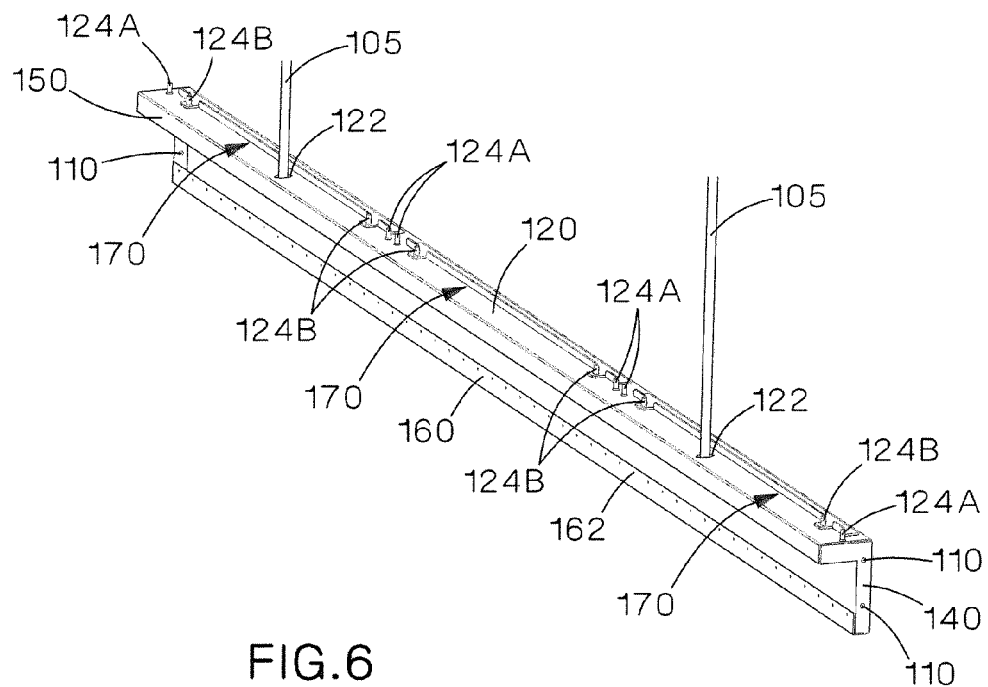
FIG. 6 is a rear perspective view of the wall beam of FIG. 5.

Referring to FIGS. 5 and 6, an exemplary wall beam 100 is shown having a generally L-shaped configuration formed by top wall 120, front wall 130, side walls 140, upper back wall 150, and lower back wall 160. Wall beam 100 is connected to threaded rods 105 that drop from a data center's ceiling grid system and extend through slots 122 formed in top wall 120. A first series of posts 124A extend from and are positioned at predetermined intervals along top wall 120 and are used to align and connect cross aisle tee beams 320 of ceiling tile support system 300 to wall beams 100, as is described in more detail below. A second series of posts 124B also extend from and are positioned at predetermined intervals along top wall 120 and are used to align and connect ceiling tile retainers 170 to wall beams 100. Ceiling tile retainers 170 have a generally L-shaped configuration formed by base plate 174 and vertical wall 172 and are used to prevent or limit the horizontal movement of an installed ceiling tile 50. A pair of tabs 176 (see FIG. 8A) extend from base plate 174 and have apertures therethrough that engage posts 124B to align and secure ceiling tile retainers to wall beams 100. A series of threaded holes 132 can also be formed through front wall 130 for use in securing alternative ceiling tile retainers 330 to wall beams 100, as described in more detail below. A series of threaded holes 162 are also formed through lower back wall 160 and are used to connect blanking panels 400, 500 to wall beams 100. Threaded holes 162 are spaced at regular increments, preferably 50 mm, to allow blanking panels 400, 500 to be installed as needed anywhere in the containment system 10.

Wall beams 100 are modular and are sized to be handled by a single installer. As with floor tracks 200, the size of the particular containment system 10 being installed dictates how many end to end wall beams 100 are needed. Adjacent wall beams 100 can be bolted together using nuts and bolts (not shown) through holes 110 to tie the system together. Wall beams 100 are installed at a predetermined height off of the raised floor tile grid 20 that corresponds to the height of blanking panels 400, 500 that will be installed.

As with floor tracks 200, the number of wall beams 100 required for a given containment system 10 is determined by the desired length of the containment system 10 being installed. Preferably, the length of each individual wall beam 100 is the same length as the corresponding floor track 200 and wall beams 100 are installed directly above floor tracks 200. Therefore, an equal quantity of both would be needed to create the containment system 10. Floor tracks 200 define the lower perimeter of the containment system 10 and wall beams 100 define the upper perimeter.

Figure 7:
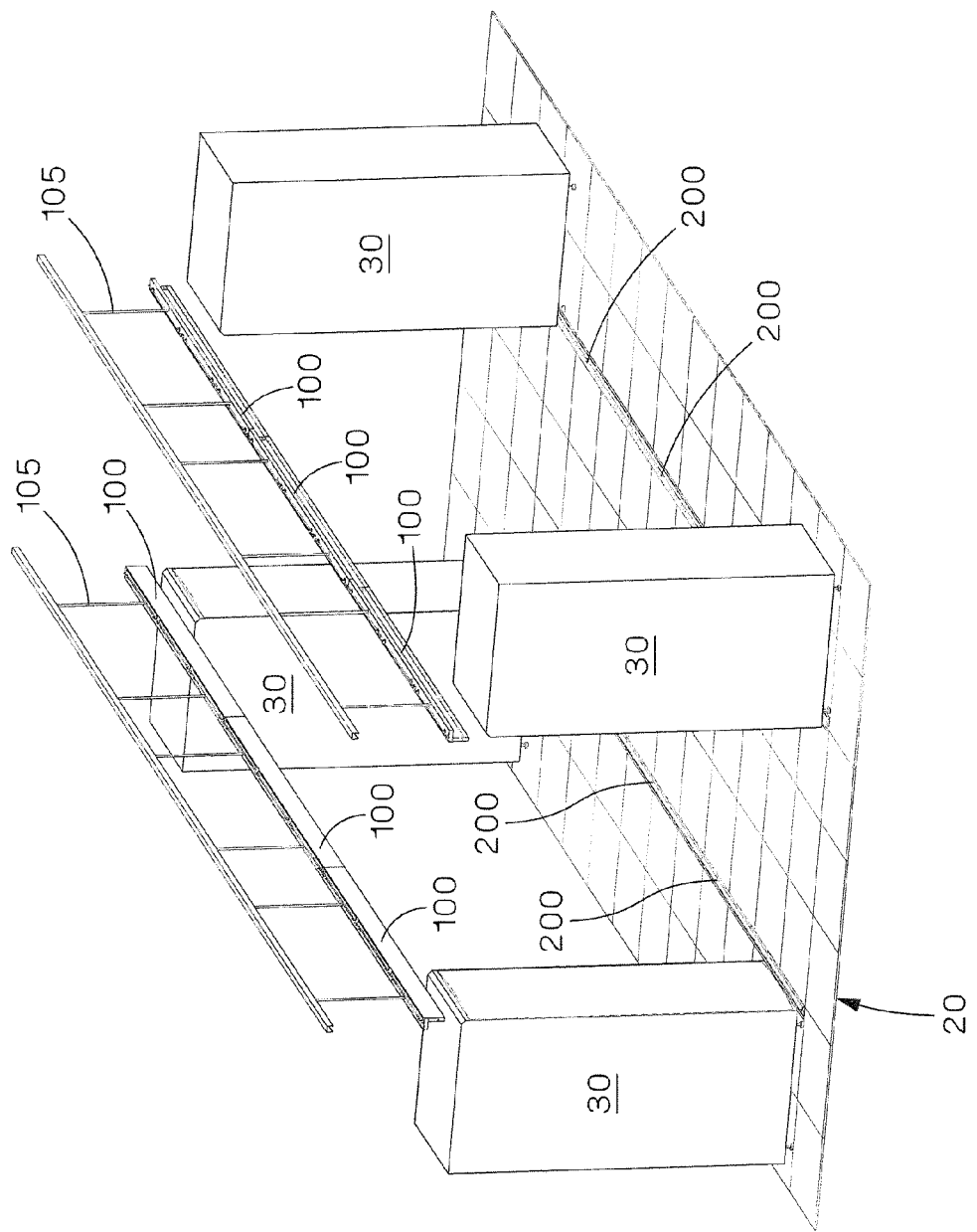
FIG. 7 is a front perspective view of a series of floor tracks and wall beams installed with corner cabinets.

Referring to FIG. 7, once floor tracks 200 and wall beams 100 are installed, corner cabinets 30 can be rolled into place at each end of each parallel track of floor tracks 200. Alternatively, installation of corner cabinets 30 can be done at any time after floor tracks 200 have been installed. Corner cabinets 30 can be any type of network, server, or other type of cabinet, such as Panduit® Net-Access™ server or switch cabinets, and are used to mount end of row doors 40. Preferably, all cabinets placed into the containment system 10, including corner cabinets 30, need to be on casters or raised onto leveling legs so that the cabinets can be positioned above floor tracks 200. In FIG. 7, a partially assembled containment system 10 is shown with two series of three floor tracks 200 secured to raised floor tile grid 20, two series of three wall beams 100 connected to threaded rods 105 that drop from the ceiling grid system, and four corner cabinets 30 properly placed.

Once all wall beams 100 have been installed, ceiling tile support system 300 is installed between wall beams 100. Ceiling tile support system 300 generally comprises cross aisle tee beams 320, center beams 340, ceiling tile retainers 170, 330, and retention brackets 350, and is used to support ceiling tiles 50 in the containment system 10.

Figure 8:
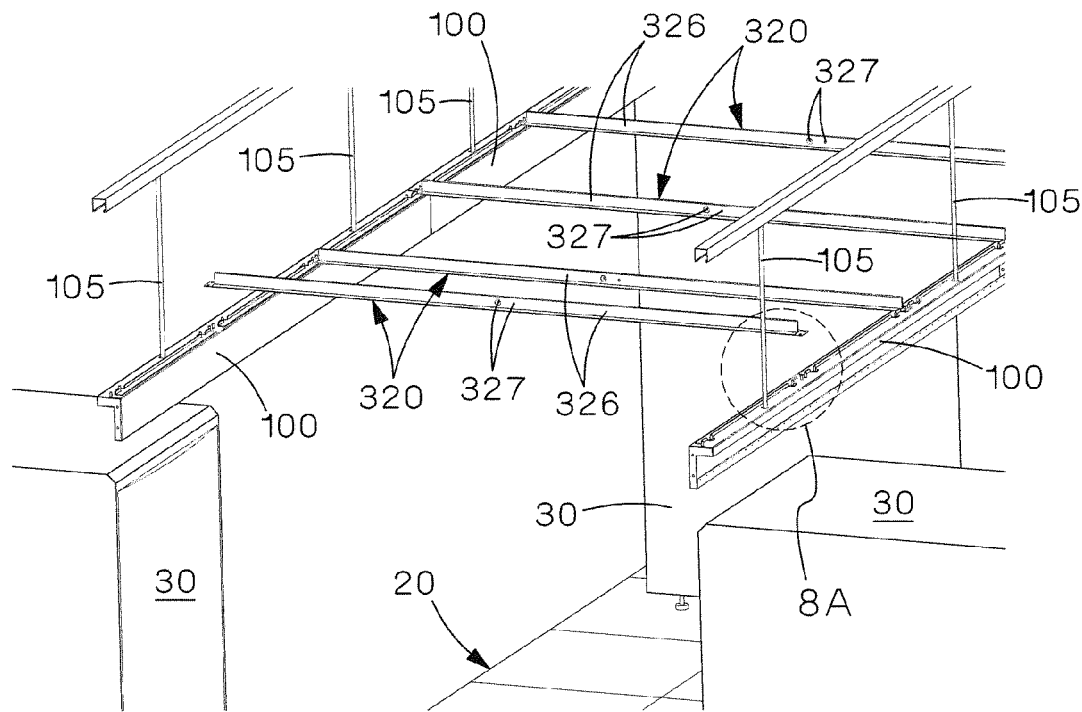
FIG. 8 is an enlarged exploded view of a series of exemplary wall beams and tee beams of the cold aisle containment system.
Figure 8A:
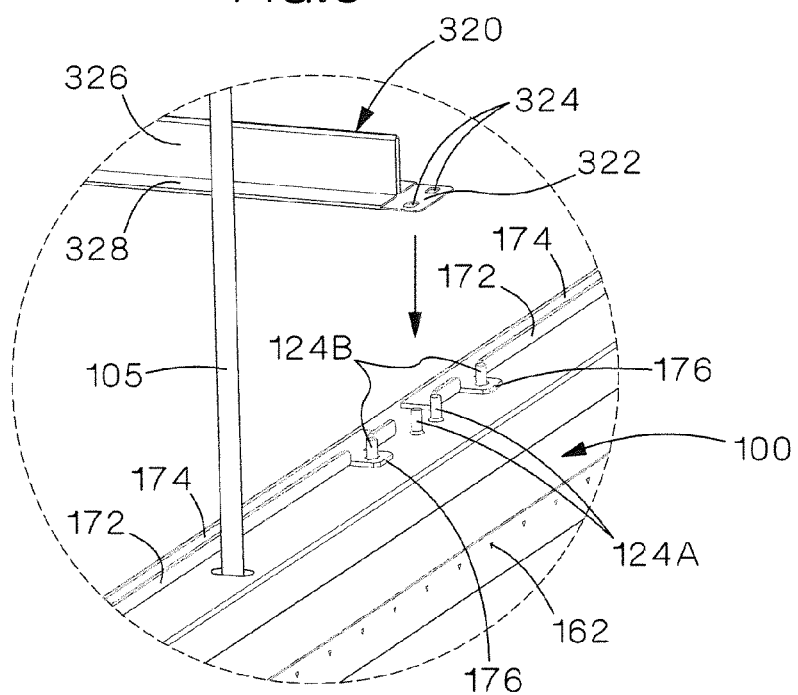
FIG. 8A is an enlarged partial view of a wall beam and tee beam of FIG. 8.

Referring to FIGS. 8 and 8A, cross aisle tee beams 320 are first installed between wall beams 100 at intervals approximately equal to the length of a ceiling tile 50. Each tee beam 320 has a generally inverted T-shaped construction comprising a generally vertical wall 326 and an intersecting general horizontal wall 328, similar to a standard drop ceiling beam, and a tab 322 extending from each end of the horizontal wall 328. Each tab 322 has a pair of holes 324 that are configured to engage the threaded posts 124A in wall beam 100. Once a tee beam 320 has been positioned between wall beams 100, nuts can be threaded onto threaded posts 124A to secure tee beam 320 to wall beams 100. Each tee beam 320 also has a pair of apertures 327 through the vertical wall 326, positioned on opposite sides of a midline of the tee beam 320, that are used to secure center beams 340 to tee beams 320. Similar to tee beams 320, L-shaped end of row support beams 360 are installed between wall beams 100 at the ends of containment system 10. End of row support beams 360 are also used to support ceiling tiles 50 and are only used at the adjacent end of row doors 40.

Figure 9:
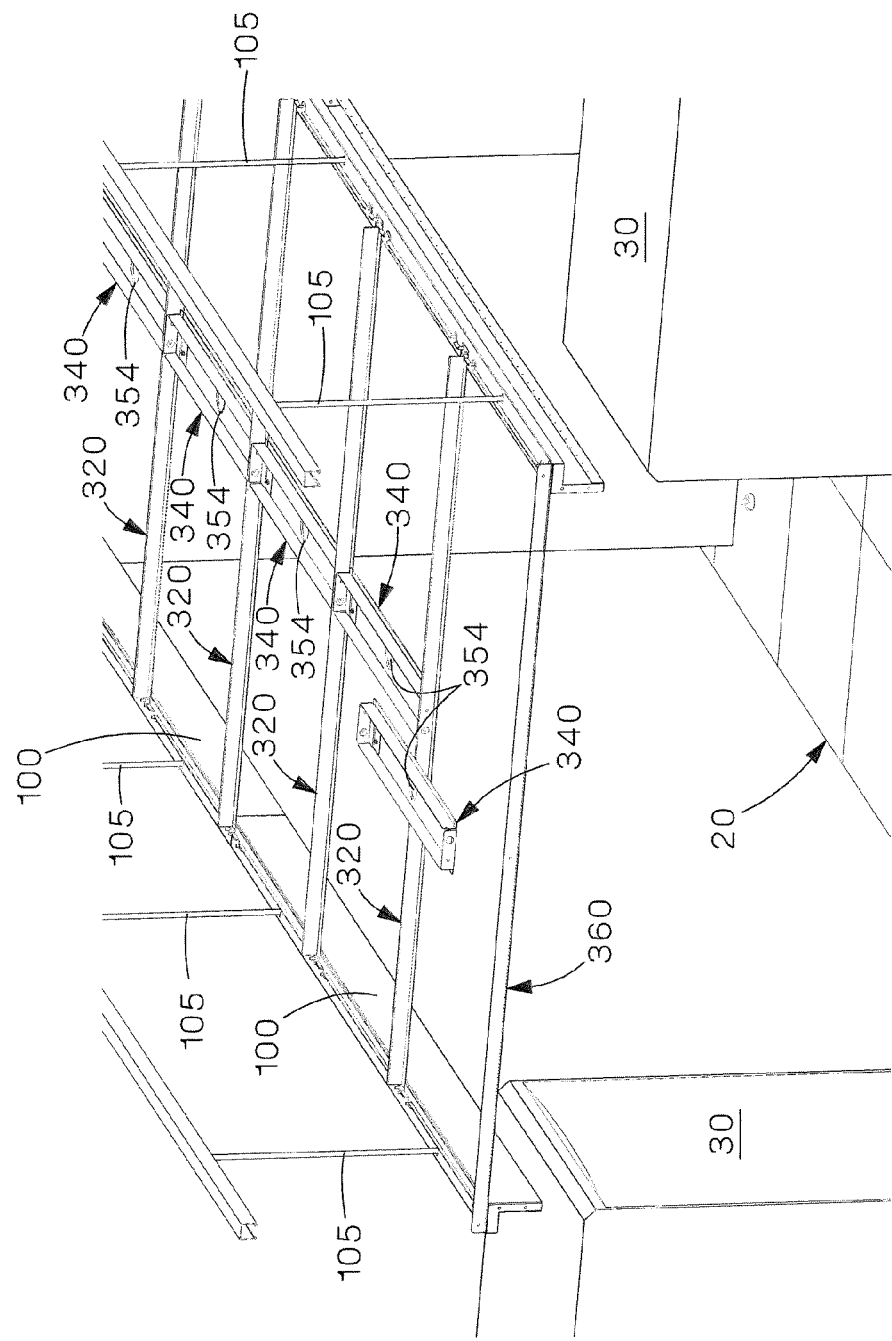
FIG. 9 is an enlarged exploded view of a series of exemplary wall beams, tee beams, and cross brackets of the cold aisle containment system.

Referring to FIGS. 9 and 12A, once tee beams 320 have been installed, a series of center beams 340 are installed between each tee beam 320 and between a tee beam 320 and end of row support beam 360. Center beams 340 are positioned along the midline of the tee beams 320 and rest on horizontal walls 328. Each center beam 340 has a pair of end walls 342 adjacent corresponding vertical walls 326 of tee beams 320. End walls 342 each have a pair of apertures 344 that align with apertures 327 in vertical walls 326 and are used to secure center beams 340 to tee beams 320. A horizontal wall 348 extends between end walls 342 and a pair of side walls 346 and has a hole 354 that can be used to install an appropriate fire suppression system or capped when not in use. A pair of support lips 352 extend outward from side walls 346 and are used as support ledges to support ceiling tiles 50.

Figure 10:
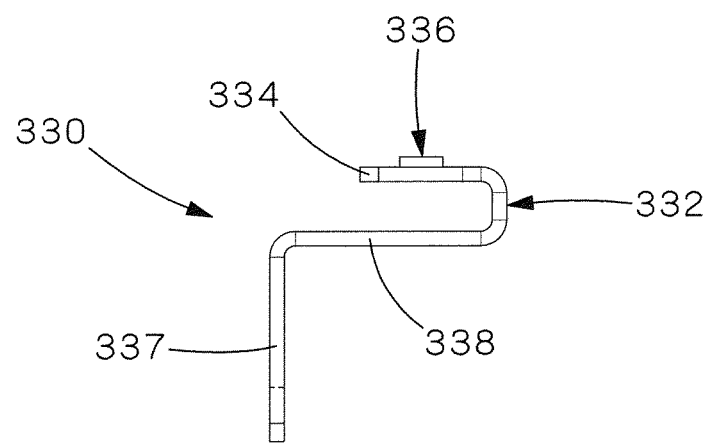
FIG. 10 is a front view of an alternative ceiling tile retainer of the cold aisle containment system.
Figure 11:
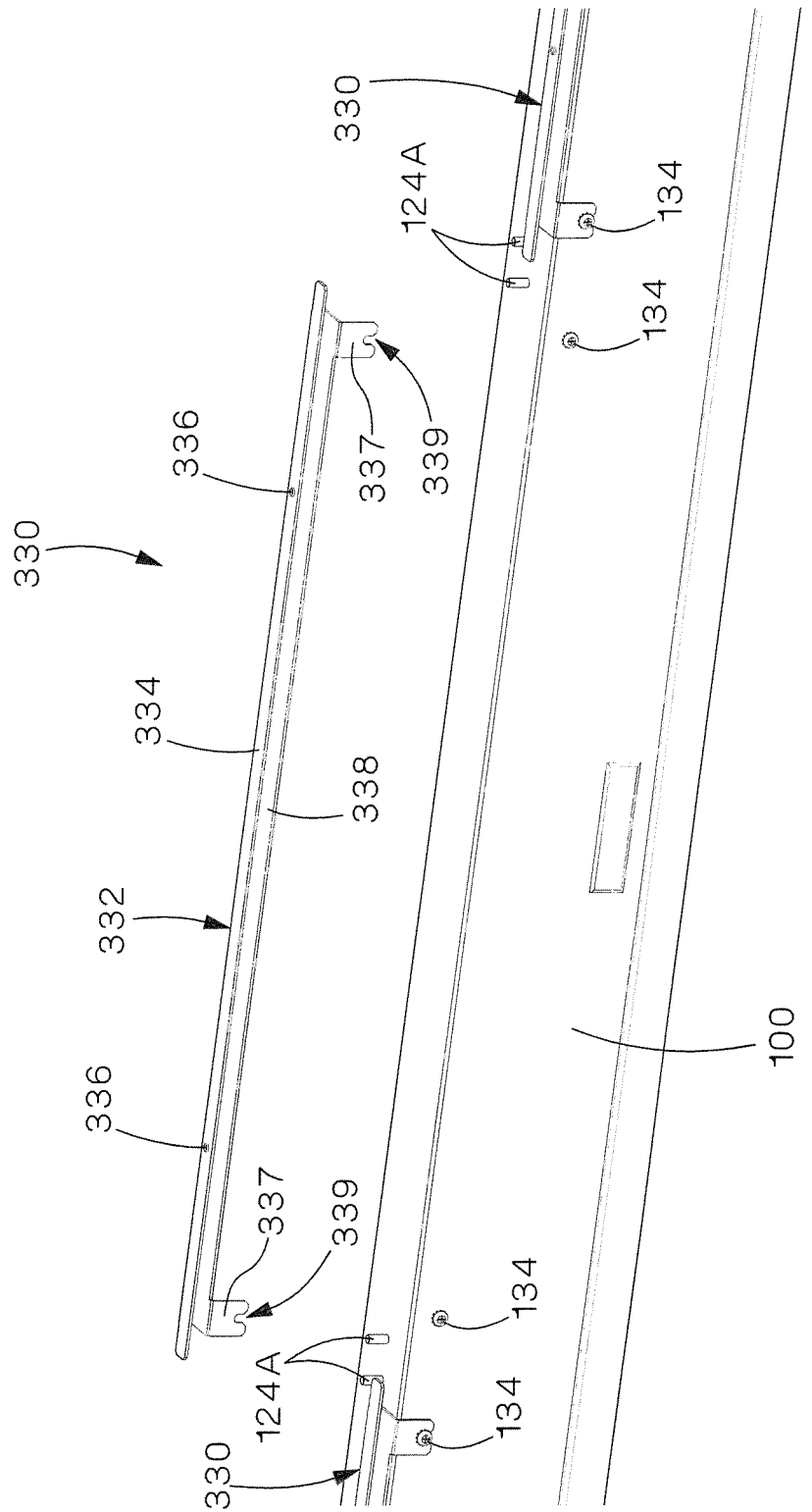
FIG. 11 is an exploded partial view of an alternative exemplary ceiling tile retainer and wall beam.

Once the tee beams 320, end of row support beams 360, and center beams 340 have been installed, ceiling tiles 50 can be placed into the openings. Referring to FIGS. 10-13, generally L-shaped retention brackets 350 are secured to side walls 346 of center beams 340 with screws or other appropriate methods. A space is left between retention bracket 350 and support lip 352 of center beam 340 that is slightly larger than the depth of ceiling tile 50. In the example shown, an alternative ceiling tile retainer 330 is secured to a second end of ceiling tile 50, opposite the first end that is adjacent center beam 340. As can be seen in FIGS. 10 and 11, ceiling tile retainer 330 has a generally U-shaped body 332 that is configured to receive ceiling tile 50 and, once installed, prevents both horizontal and vertical movement of ceiling tiles 50. Two threaded holes 336 are formed through the upper wall 334 of body 332, which allows screws (not shown) to secure ceiling tile retainer 330 to ceiling tile 50. This prevents ceiling tile retainer 330 from falling off ceiling tile 50 when an installer removes ceiling tile 50 from ceiling tile support system 300. A pair of tabs 337 extend from a lower wall 338 of body 332. Each tab 337 has a slot 339 that is configured to engage a screw 134 threaded into holes 132 in front wall 130 of wall beam 100 to secure retainer 330 to wall beam 100. Slots 339 and screws 134 allow ceiling tile 50 and retainer 330 to be easily installed and removed by simply loosening screws 134 and lifting retainer 330 free of wall beam 100. As shown in FIG. 11, posts 124B have been removed from the top of wall beam 100 and are not required when alternative ceiling tile retainer 330 is used. However, a standard wall beam 100 with posts 124B could also be used, although posts 124B will not be engaged.

Figure 12:
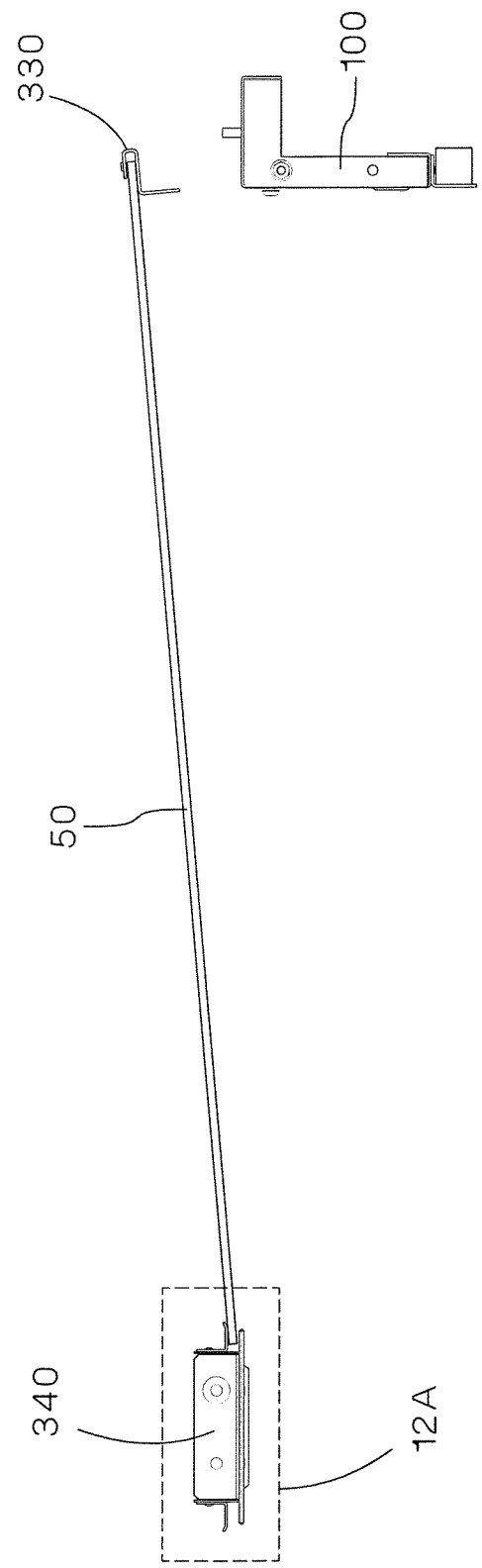
FIG. 12 is a front view of a ceiling tile being installed between a tee beam and wall beam of the cold aisle containment system.
Figure 13:
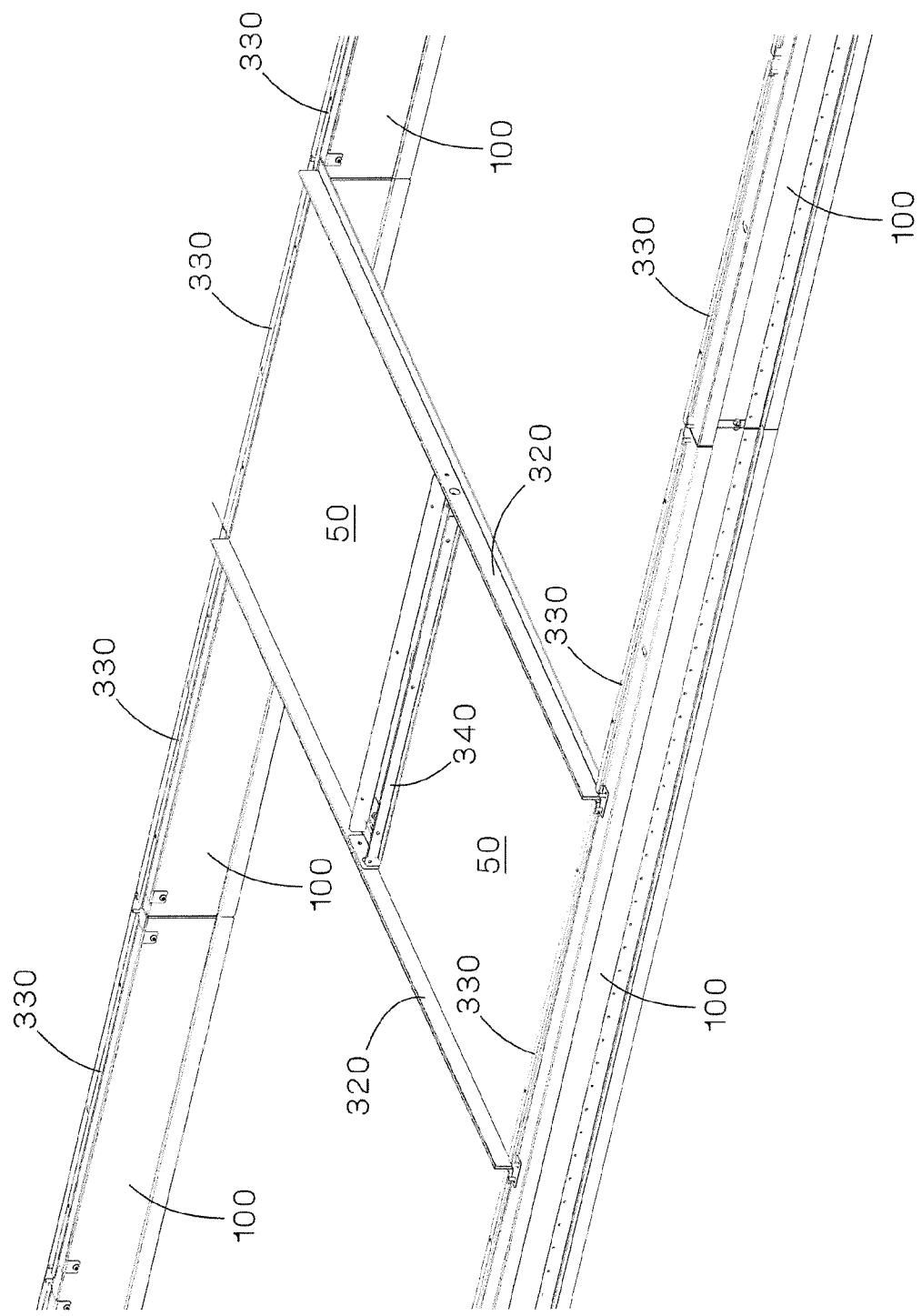
FIG. 13 is a partial front perspective view of a series of ceiling tiles installed between wall beams of the cold aisle containment system.

As shown in FIGS. 12 and 12A, to install ceiling tile 50 a first end of ceiling tile is inserted between retention bracket 350 and support lip 352 of center beam 340. In the example shown, ceiling tile retainer 330 is also mounted to ceiling tile 50 and locked into place with screws, as described above. Ceiling tile 50 is then pivoted until it is perpendicular to wall beam 100 and slots 339 in ceiling tile retainer 330 engage screws 134 in wall beam 100. Ceiling tile 50 is the secured into place by tightening screws 134.

To enclose the containment area until future cabinets are installed, blanking panels 400, 500 are used. Blanking panels 400, 500 rest on floor tracks 200 and extend to wall beams 100 to create a barrier to prevent escape of cool air from the containment area. To account for the wide variety of different cabinet widths that could potentially be installed, a flexible system is needed. This flexibility is accomplished with the combination of two types of exemplary blanking panels: an adjustable blanking panel 400 that is about a cabinet wide with adjustable side panels (FIGS. 20A-E); and a narrow fixed blanking panel 500 (FIG. 19).

Figure 19:
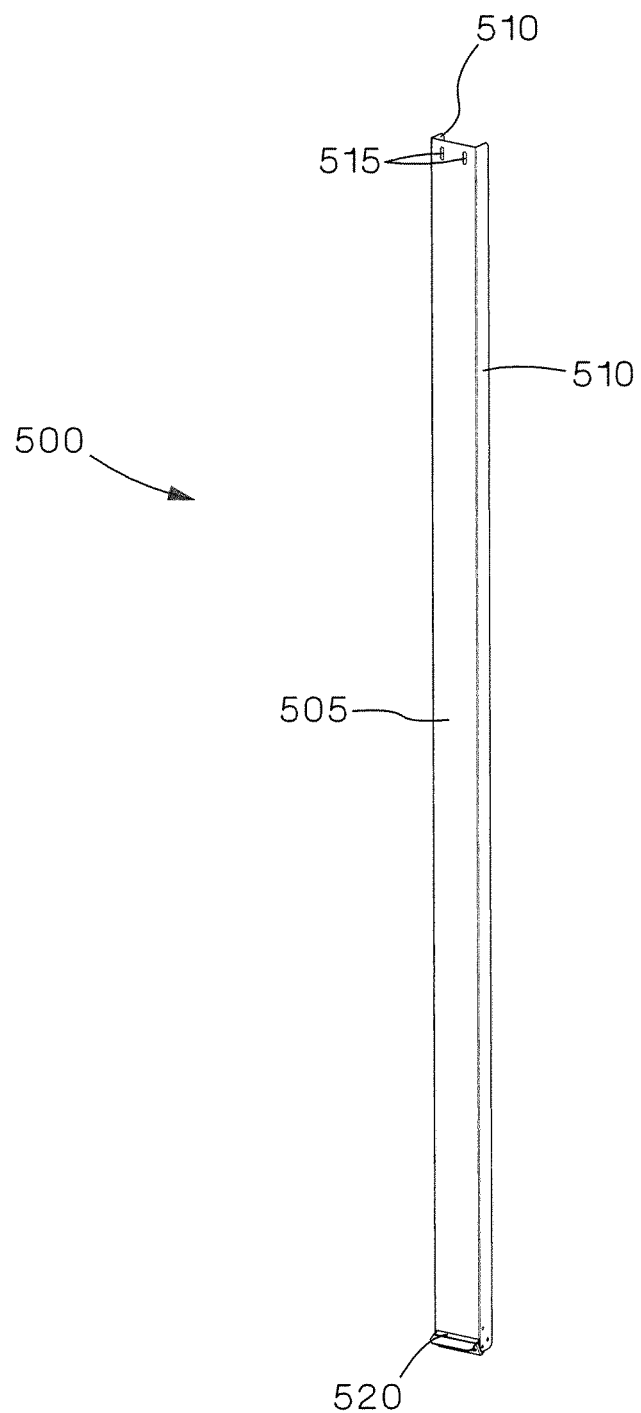
FIG. 19 is a front perspective view of an exemplary fixed blanking panel.
Figure 20A:
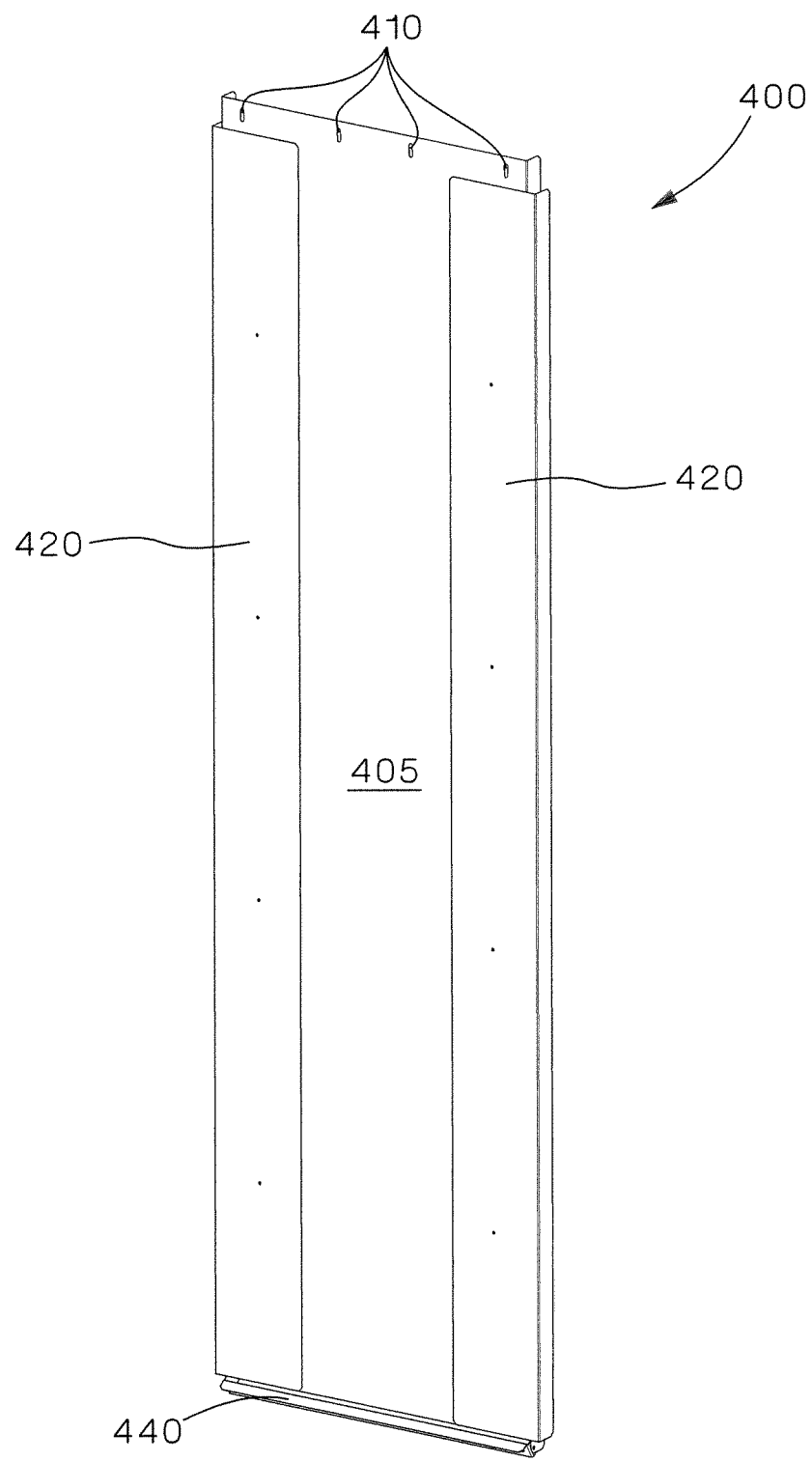
FIG. 20A is a front perspective view of an exemplary adjustable blanking panel in a retracted position.
Figure 20B:
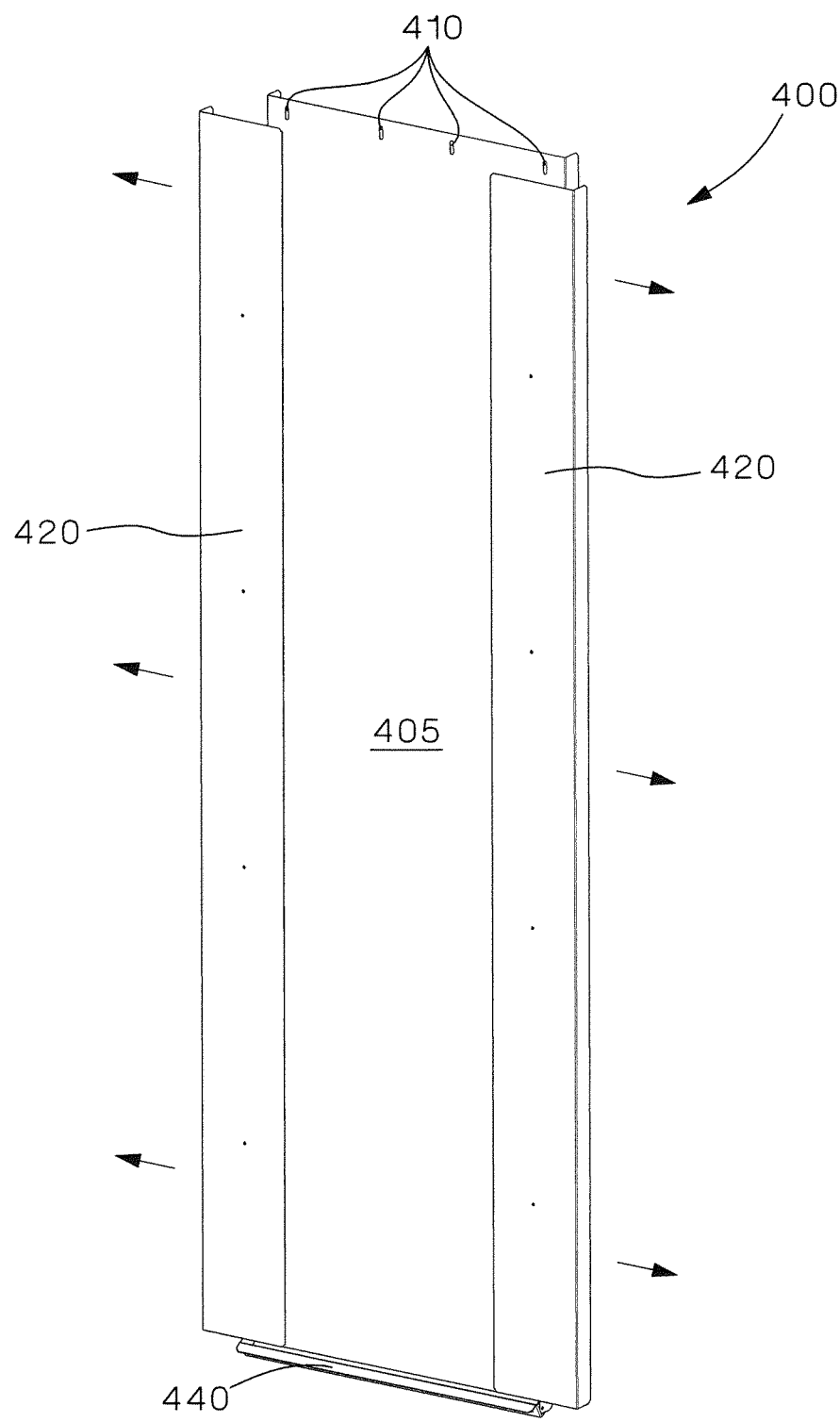
FIG. 20B is a front perspective view of the adjustable blanking panel of FIG. 20A in an extended position.
Figure 20C:
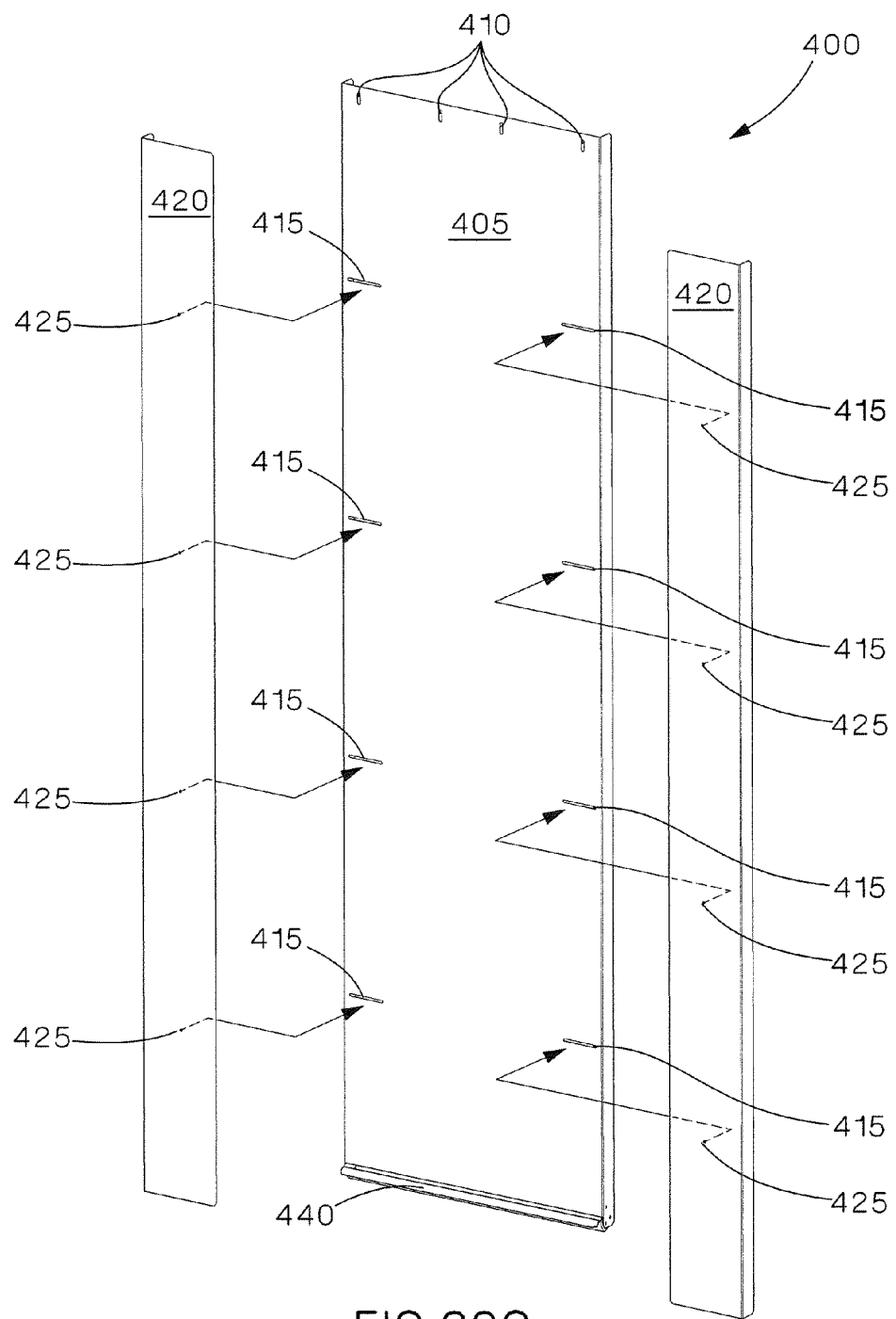
FIG. 20C is an exploded front perspective view of the adjustable blanking panel of FIG. 20A.
Figure 20E:
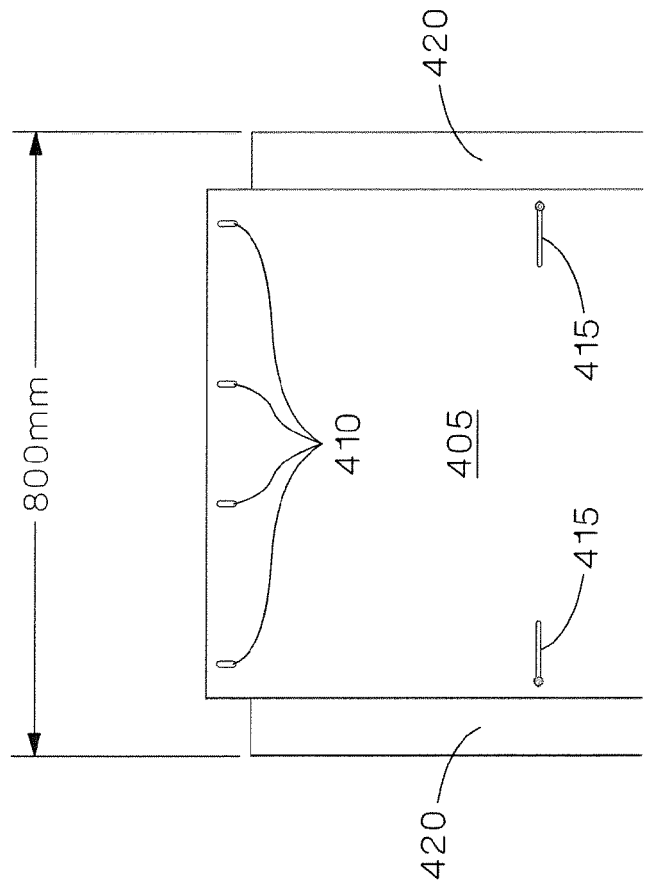
FIG. 20E is a partial rear view of the adjustable blanking panel of FIG. 20A in a fully extended position.
Figure 20D:
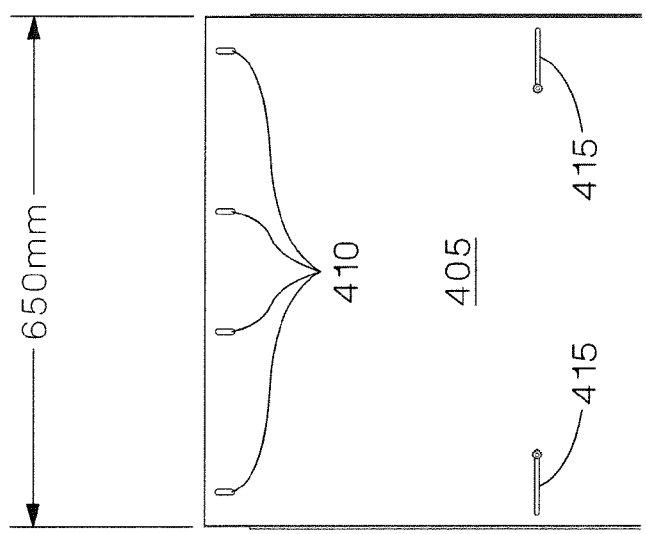
FIG. 20D is a partial rear view of the adjustable blanking panel of FIG. 20A in a fully retracted position.

Referring to FIG. 19, fixed blanking panel 500 has a main panel 505 and two side panels 510 that extend from opposite sides of main panel 505. A set of slots 515 are formed along the top of main panel 505 and are configured to align with threaded holes 162 in lower back wall 160 of wall beam 100. A generally V-shaped base member 520, which is essentially the same as base member 440 of adjustable blanking panel 400, is secured to the bottom of the panels 505, 510 and is used to secure fixed blanking panel 500 to floor tracks 200.

Referring to FIGS. 20A-E, adjustable blanking panel 400 has a main panel 405 and two adjustable side panels 420. A first set of slots 410 are formed along the top of main panel 405 and are configured to align with threaded holes 162 in lower back wall 160 of wall beam 100. A second set of slots 415 are formed along each side of main panel 405 and are configured to align with holes 425 in side panels 420. Adjustable side panels 420 are secured to main panel 405 by threaded studs inserted through holes 425 in side panel 420 and slots 415 in main panel 405. Side panels 420 can slide in slots 415 to expand or contract the overall size of adjustable blanking panel 400. A generally V-shaped base member 440 is secured to the bottom of main panel 405 and is used to secure adjustable blanking panel 400 to floor tracks 200. As can best be seen in FIG. 14A, base member 440 has the same profile as floor track 200. A first wall 445 engages back wall 220 of floor track 200 and a second wall 450 engages connecting wall 240 so that base member 440 rests on floor track 200. A series of slots 447 are formed in first wall 445 and generally align with threaded holes 222 in floor track 200 to secure adjustable blanking panel 400 to floor track 200.

Figure 14:
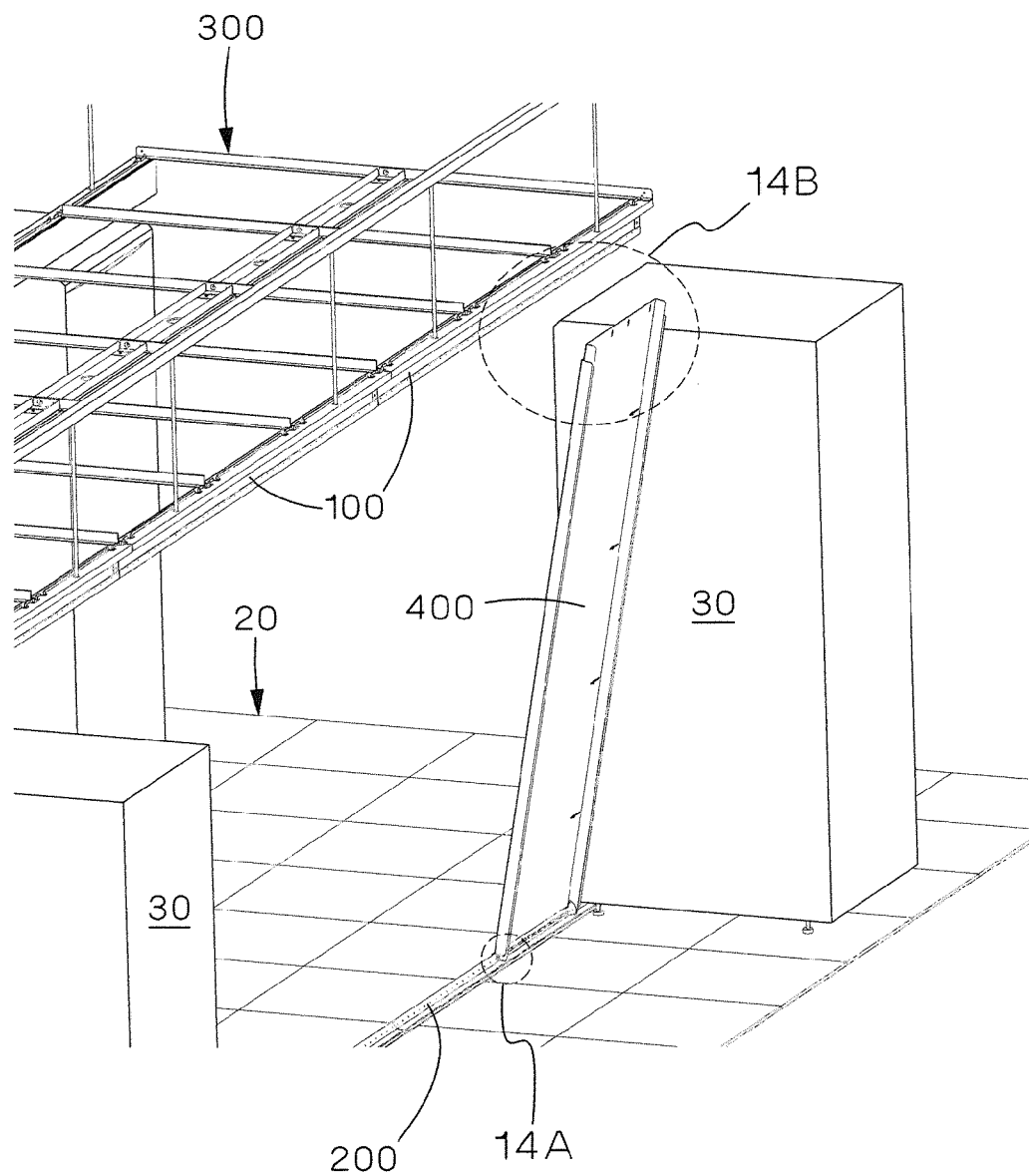
FIG. 14 is a partial front perspective view of an exemplary adjustable blanking panel being installed between a floor track and wall beam of the cold aisle containment system.
Figure 14A:
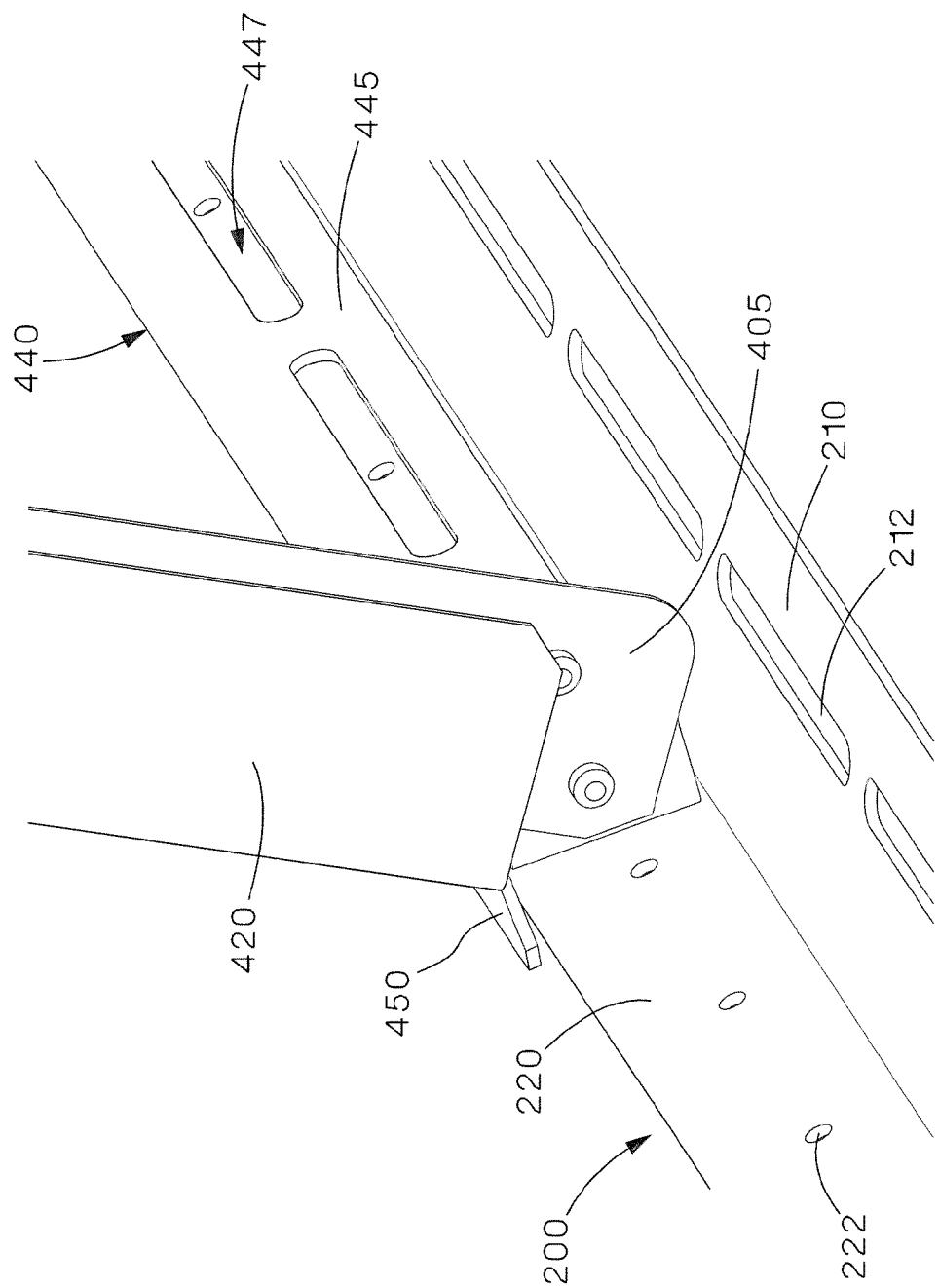
FIG. 14A is an enlarged partial view of the bottom of the adjustable blanking panel in FIG. 14.

As can be seen in FIG. 14, adjustable blanking panel 400 and fixed blanking panel 500 are both installed by placing the respective base member 440, 520 on floor track 200 and rotating the panel into position until the main panel 405, 505 contacts wall beam 100. Screws are used to secure the base members 440, 520 to floor tracks 200 through threaded holes 222 and main panels 405, 505 to wall beams 100 through slots 410, 515 and threaded holes 162. Both blanking panels 400, 500 can be positioned along wall beam 100/floor track 200 in 50 mm increments for future reconfiguration needs.

Figure 15:
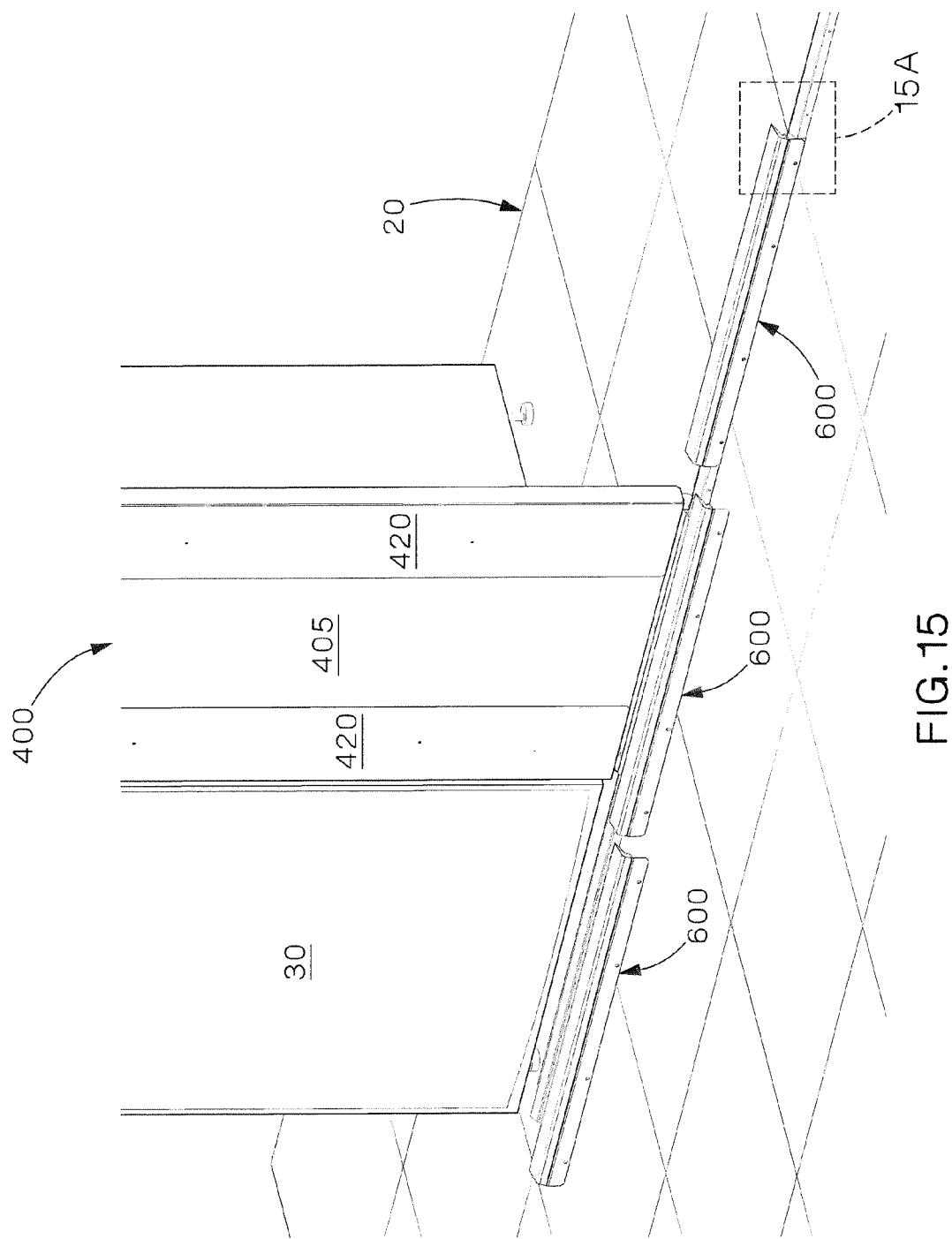
FIG. 15 is partial exploded side perspective view of exemplary floor skirts of the cold aisle containment system.
Figure 16:
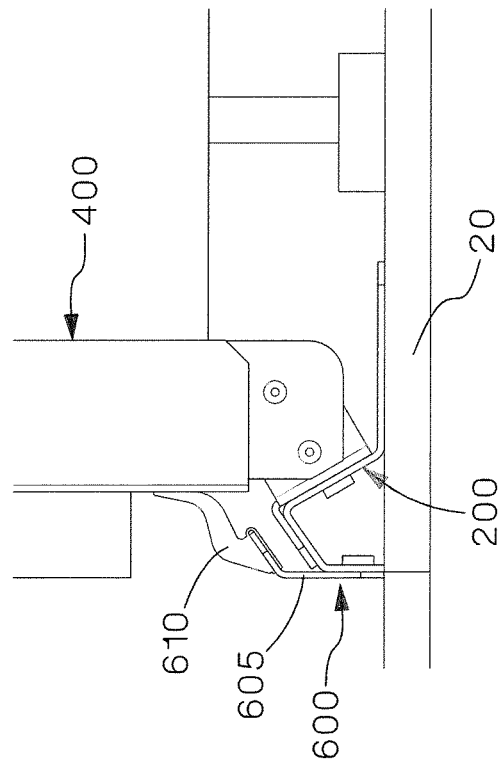
FIG. 16 is a side view of an exemplary floor skirt installed against an adjustable blanking panel.
Figure 15A:
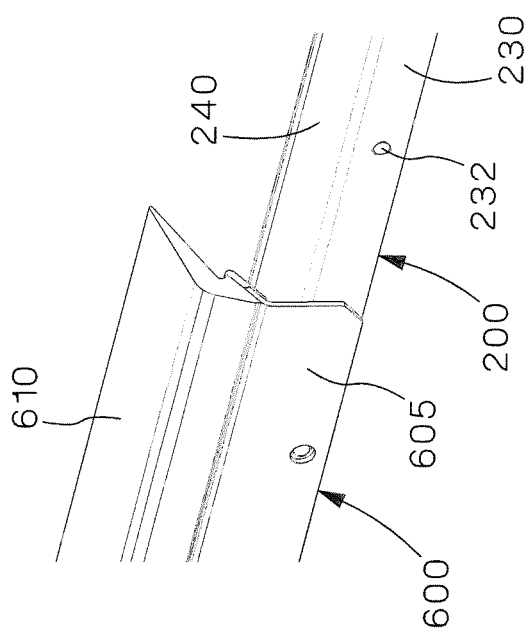
FIG. 15A is an enlarged partial perspective view of a floor skirt of FIG. 15.

As shown in FIGS. 15-16, to seal the containment system 10 at the floor level, floor skirts 600 are added to floor tracks 200. Floor skirts 600 have a rigid base member 605 that can be secured to floor track 200 by screws or other threaded members through threaded holes 232 in front wall 230 of floor track 200. Flexible rubber seal 610 is secured to and extends from base member 605 and butts up against blanking panels 400, 500 and/or installed cabinets to seal the containment system 10 at the bottom. The rigid base members 605 of the floor skirts 600 are fastened along the entire length of floor tracks 200. FIG. 15 shows the first two floor skirts 600 not fully installed for clarity. FIG. 16 shows a side view detail of a floor skirt 600 sealing against an adjustable blanking panel 400.

Figure 17:
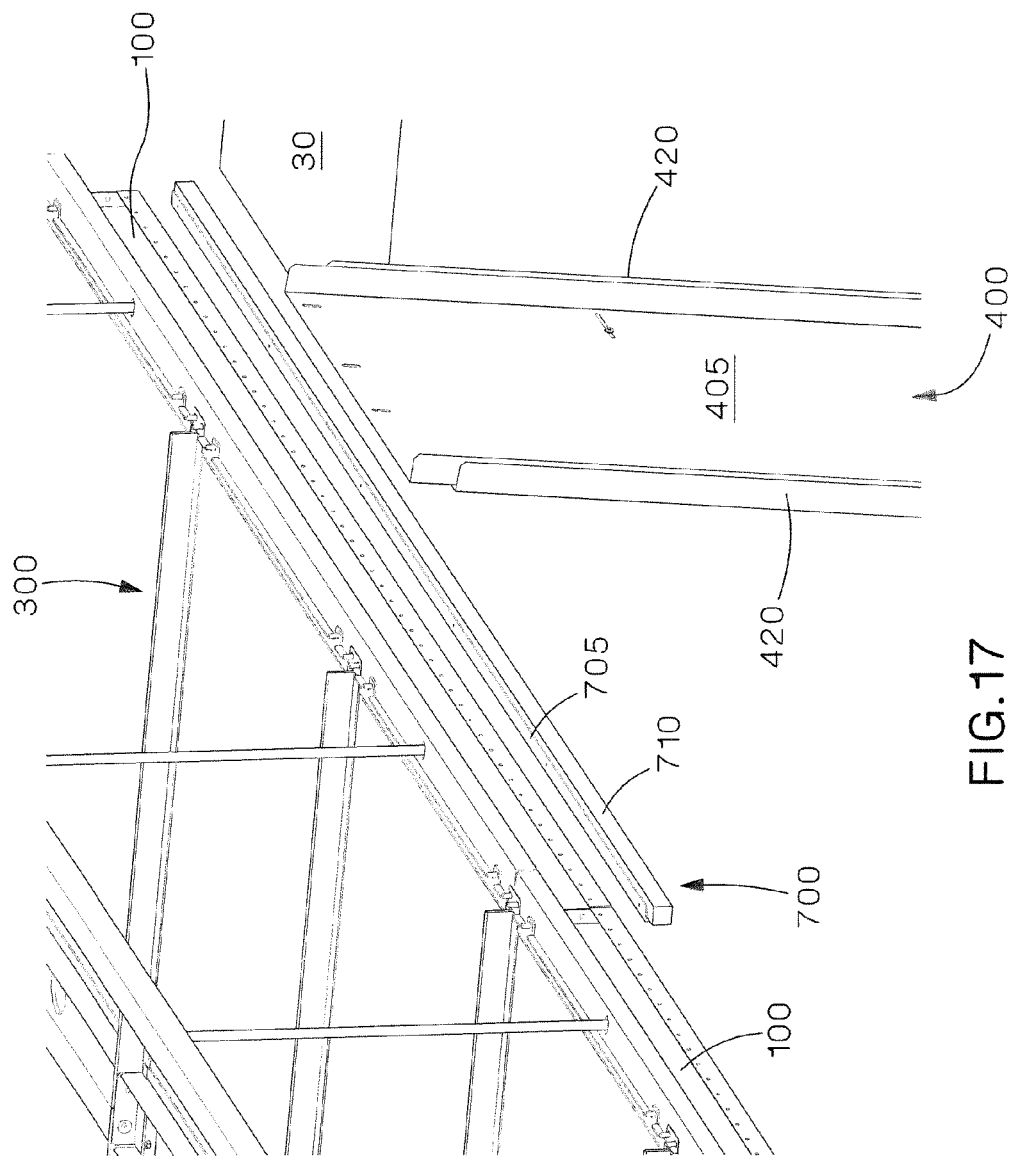
FIG. 17 is a partial exploded side perspective view of an exemplary upper sealing bracket being installed between a wall beam and an adjustable blanking panel of the cold aisle containment system.
Figure 18:
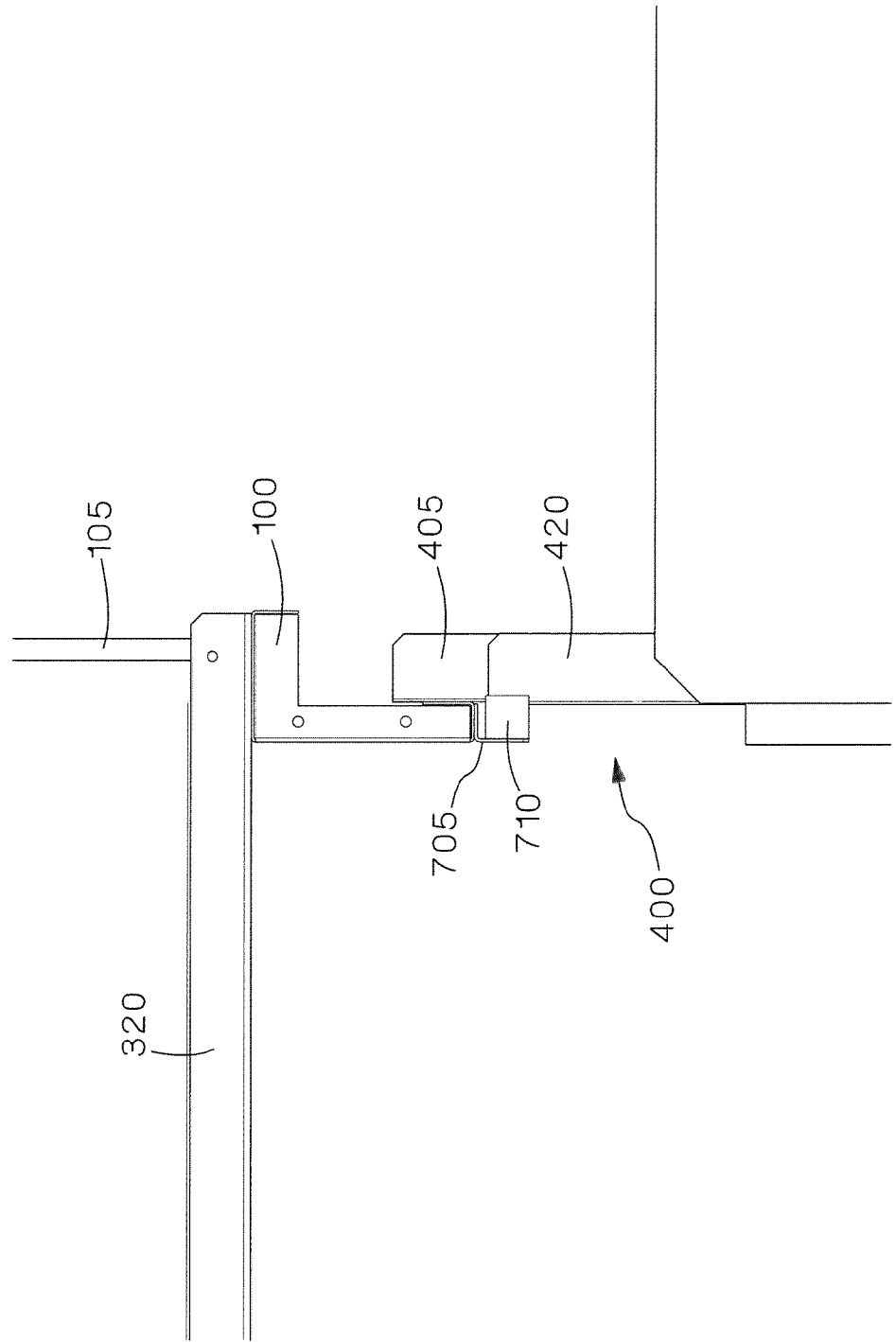
FIG. 18 is a partial side view of the exemplary upper sealing bracket as installed.

As shown in FIGS. 17 and 18, to seal the containment system 10 at the top, an upper sealing bracket 700 is mounted to the underside of wall beam 100. Upper sealing bracket 700 has a generally L-shaped bracket 705 and a continuous foam strip 710 mounted along bracket 705. Foam strip 710 protrudes outward towards blanking panel 400/500 and compresses against main panel 405, 505 to seal the units together.

Figure 21:
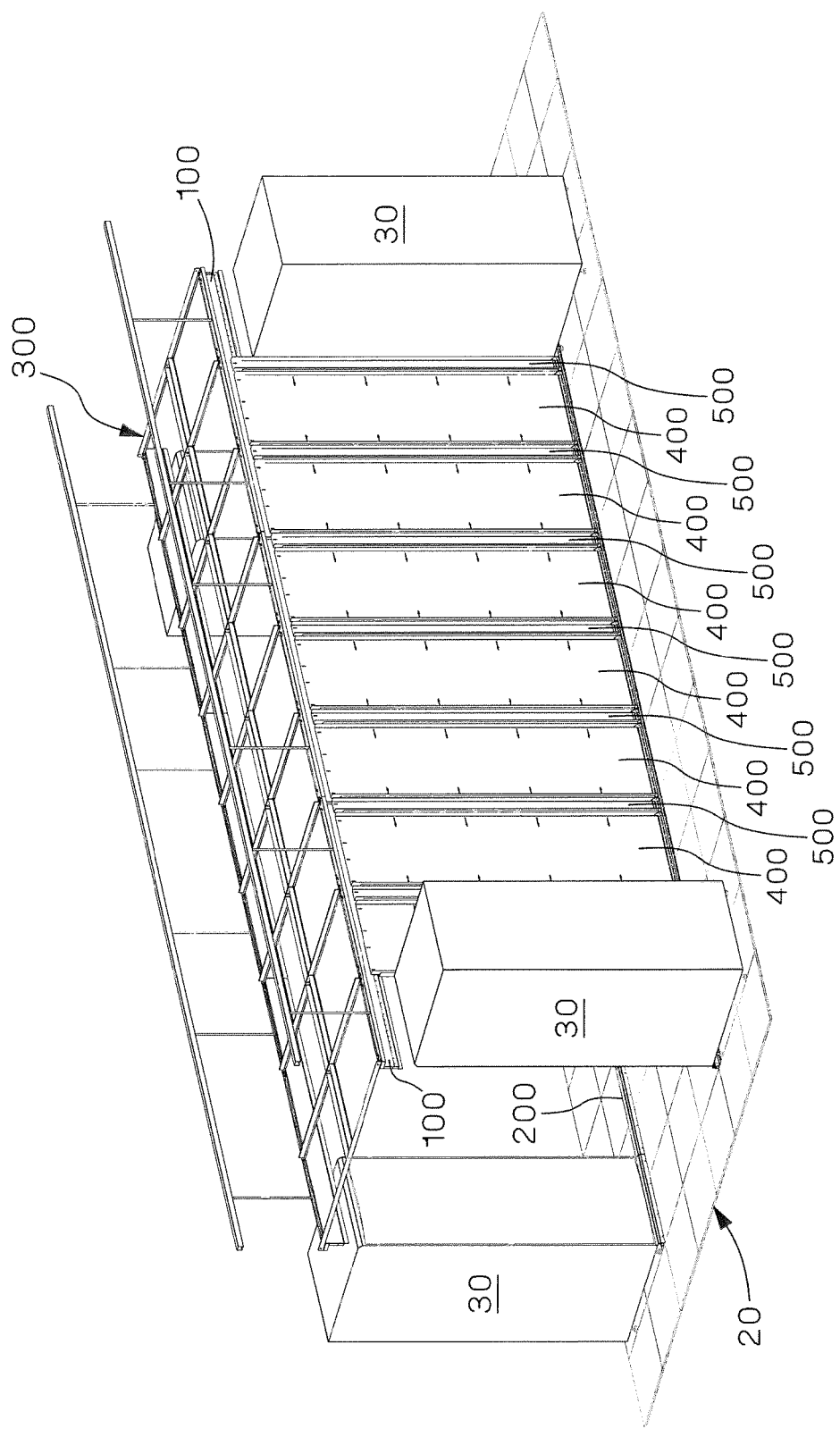
FIG. 21 is a side perspective view of a fully installed cold aisle containment system.
Figure 22:
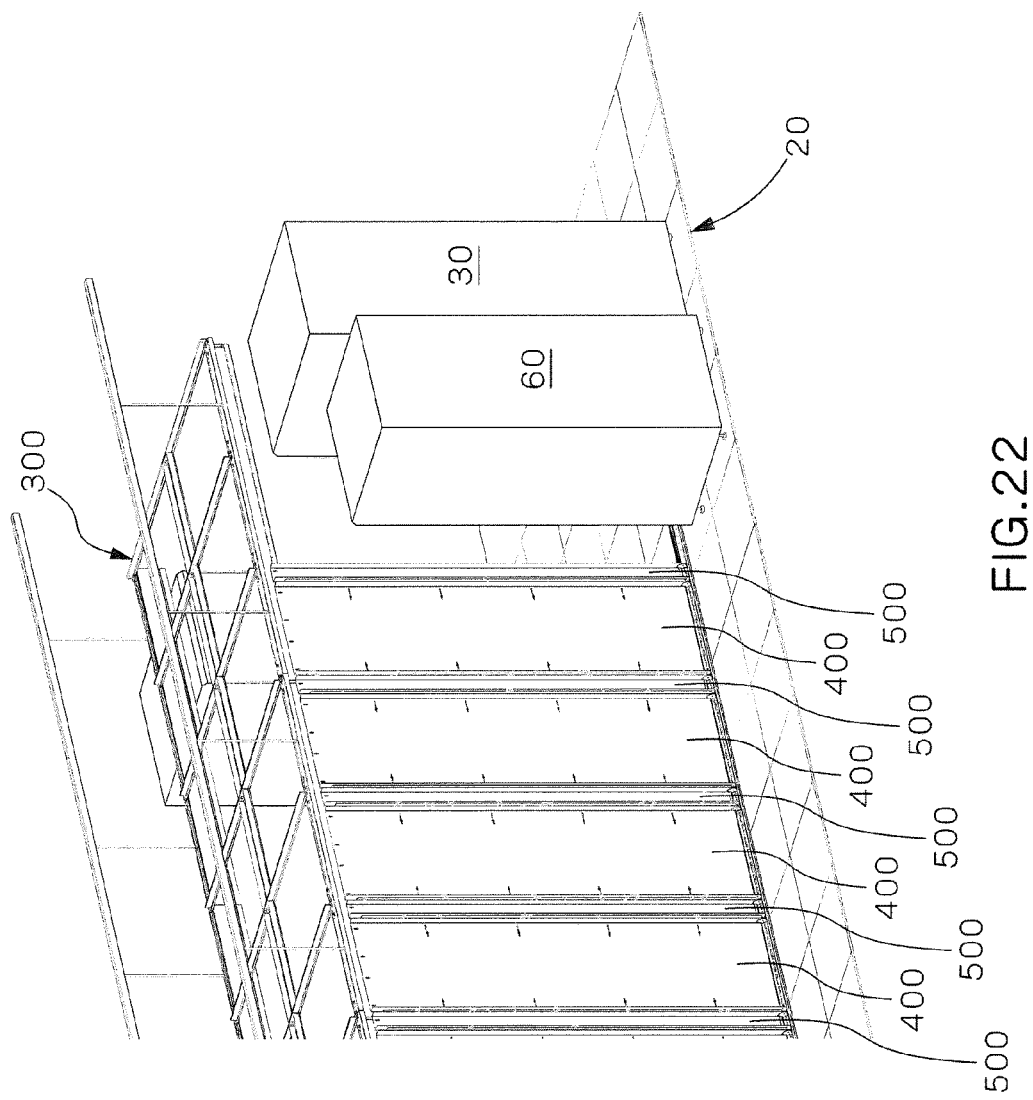
FIG. 22 is a partial side perspective view of an additional cabinet being installed in the cold aisle containment system.

During initial installation, adjustable blanking panels 400 and fixed blanking panels 500 are alternated as they are installed. FIG. 21 shows one side of containment system 10 fully filled with alternating adjustable blanking panels 400 and fixed blanking panels 500. In the example shown, an adjustable blanking panel 400 in a fully retracted position is about 650 mm wide (see FIG. 20D) and in a fully extended position is just less than 800 mm wide (see FIG. 20E) and can be factory set at 700 mm wide. Adjustable blanking panels 400 also have foam type seals on the outer sides of side panels 420 to seal side to side with adjacent panels and/or cabinets. Therefore, the overall width of adjustable blanking panels 400 will be slightly larger than stated above. In the example shown, the fixed blanking panel 500 is 100 mm wide. The adjustable blanking panels 400 and fixed blanking panels 500 can both be moved along wall beams 100/floor tracks 200 in 50 mm increments to allow course adjustments. Fine adjustments can then be made by moving side panels 420 on adjustable blanking panel 400. Once containment system 10 has been fully installed, as future cabinets are installed, blanking panels 400, 500 can be removed as needed.

Using the exemplary adjustable blanking panels 400 and fixed blanking panels 500 described above, an adjustable blanking panel 400 and fixed blanking panel 500 side by side measures approximately 800 mm wide. Therefore, if a cabinet 60 that is 800 mm wide will be installed, one of each blanking panel 400, 500 will be removed. If a cabinet 60 that is 700 mm wide will be installed, only an adjustable blanking panel 400 will need to be removed. If a cabinet 60 that is 600 mm wide will be installed, one adjustable blanking panel 400 is removed and the adjacent fixed blanking panel 500 and adjustable blanking panel 400 are repositioned and adjusted. The fact that 24 inch (610 mm), 30 inch (762 mm), and other sized cabinets 60 (as well as different combinations of these sizes) may be placed into the containment system 10 requires this type of flexibility. Once the containment system 10 is nearly fully populated with cabinets of different sizes, the remaining area could easily be less than the width of an adjustable blanking panel 400. At this point, fixed blanking panels 500 can be utilized to fill the remaining small area.

Figure 23:
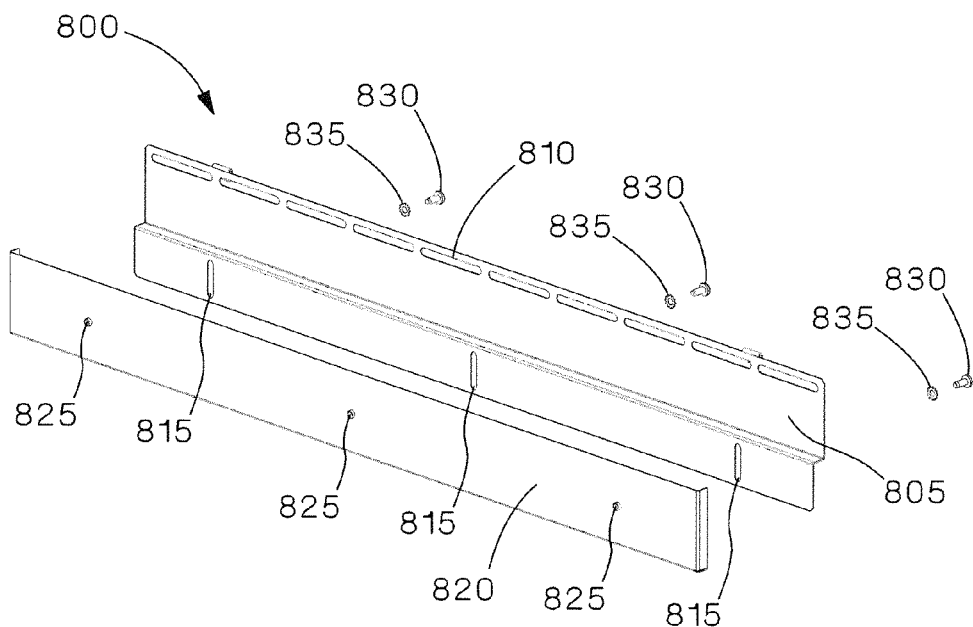
FIG. 23 is an exploded side perspective view of an exemplary above cabinet blanking panel.
Figure 24:
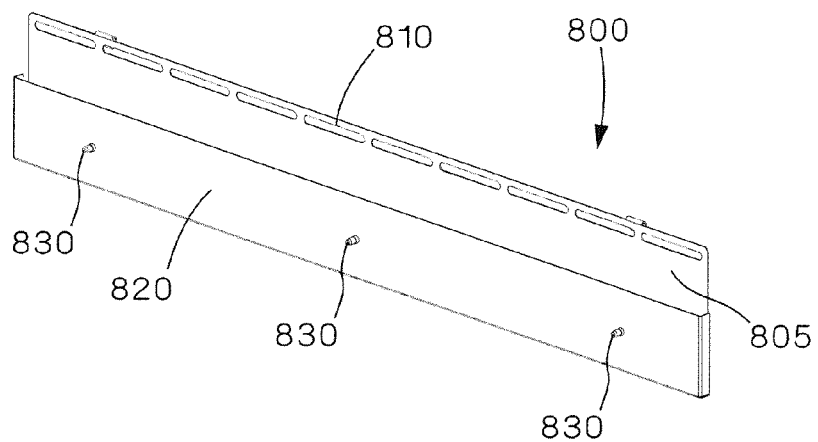
FIG. 24 is a side perspective view of the above cabinet blanking panel of FIG. 23.
Figure 25:
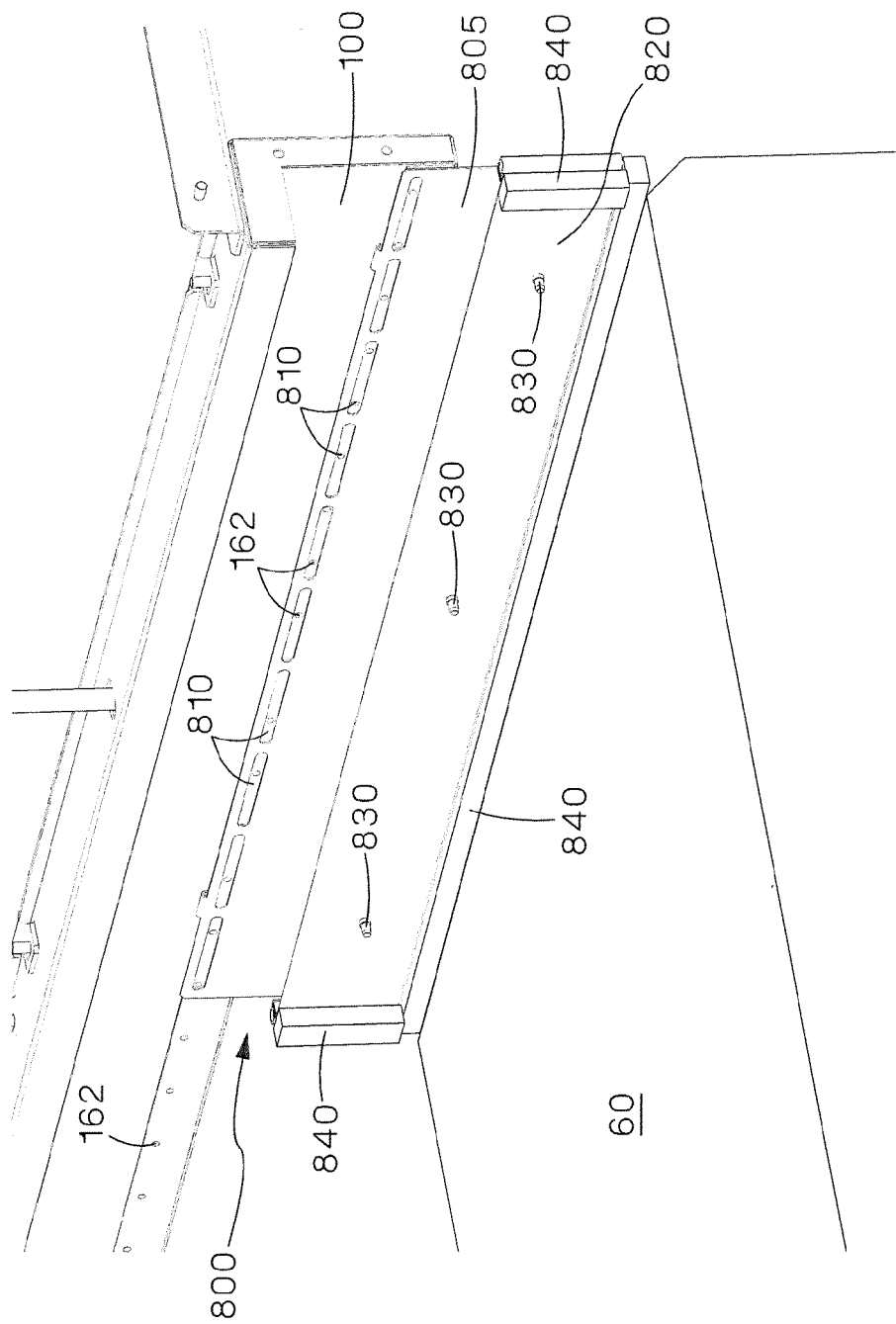
FIG. 25 is a side perspective view of the above cabinet blanking panel of FIG. 23 installed with a wall beam and cabinet.

Once the desired cabinets 60 have been installed, the space above cabinets 60 must be sealed if cabinets 60 do not reach the full height of wall beams 100. Referring to FIGS. 23-25, an exemplary above cabinet blanking panel 800 is shown, which can be used to seal the space above undersized cabinets 60. The overall height and width above cabinet blanking panel 800 depends on the height and width of a particular cabinet 60 being installed. An upper panel 805 of above cabinet blanking panel 800 has a set of horizontal slots 810 that are used to secure above cabinet blanking panel 800 to a wall beam 100 anywhere along the length of wall beam 100. Screws (not shown) or other threaded members can be used secure above cabinet blanking panel 800 to a wall beam 100 by inserting the screws through horizontal slots 810 and threading the screws into threaded holes 162 in wall beam 100. Lower panel 820 is secured to upper panel 805 via washers 835 and screws 830 that pass through vertical slots 815 in upper panel 805 and thread into threaded holes 825 in lower panel 820. This allows lower panel 820 to be vertically adjusted to match the top of cabinet 60.

FIG. 25 shows an exemplary above cabinet blanking panel 800 installed above a corresponding cabinet 60. To create a seal, foam seals 840 are placed along the side and bottom edges of lower panel 820 to seal above cabinet blanking panel 800 to the top of cabinet 60 as well as to adjacent components (such as a blanking panel 400, 500, another above cabinet blanking panel 800, or another cabinet 60). In the example shown, the vertical adjustment to lower panel 820 is made from the interior of containment system 10 (the cold aisle) for convenience. Lower panel 820 can be adjusted vertically to facilitate sealing against cabinet 60.

Figure 26:
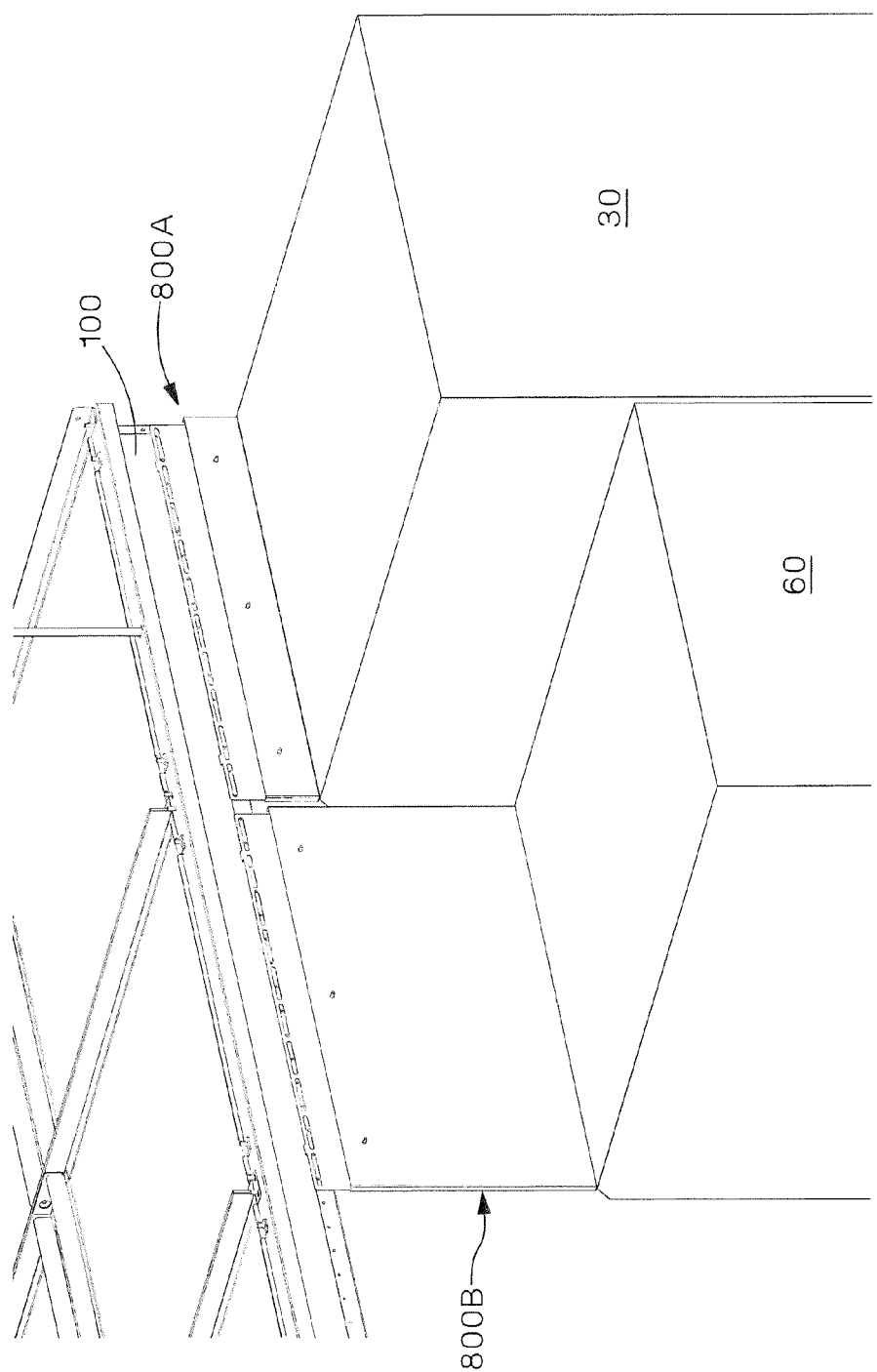
FIG. 26 is a side perspective view of two different above cabinet blanking panels installed with a wall beam and different size cabinets.

FIG. 26 shows a corner cabinet 30 and a cabinet 60 side by side with corresponding above cabinet blanking panels 800A, 800B installed (foam seals 840 are removed for clarity) and highlights why certain above cabinet blanking panels 800 need to be cabinet specific based on a cabinet's particular height and width. Since above cabinet blanking panels 800 are vertically adjustable, they can be used with multiple types of cabinets that have the same width but only a small difference in height. However, different height and width above cabinet blanking panels 800 are required for cabinets having different widths or large differences in height. Above cabinet blanking panels 800 also have to be capable of being installed anywhere along wall beams 100 to match wherever a cabinet may be placed. This is accomplished by the horizontal slots 810 in upper panel 805 of above cabinet blanking panels 800 and threaded holes 162 in wall beams 100, which are spaced at 50 mm increments along wall beam 100.

Figure 27:
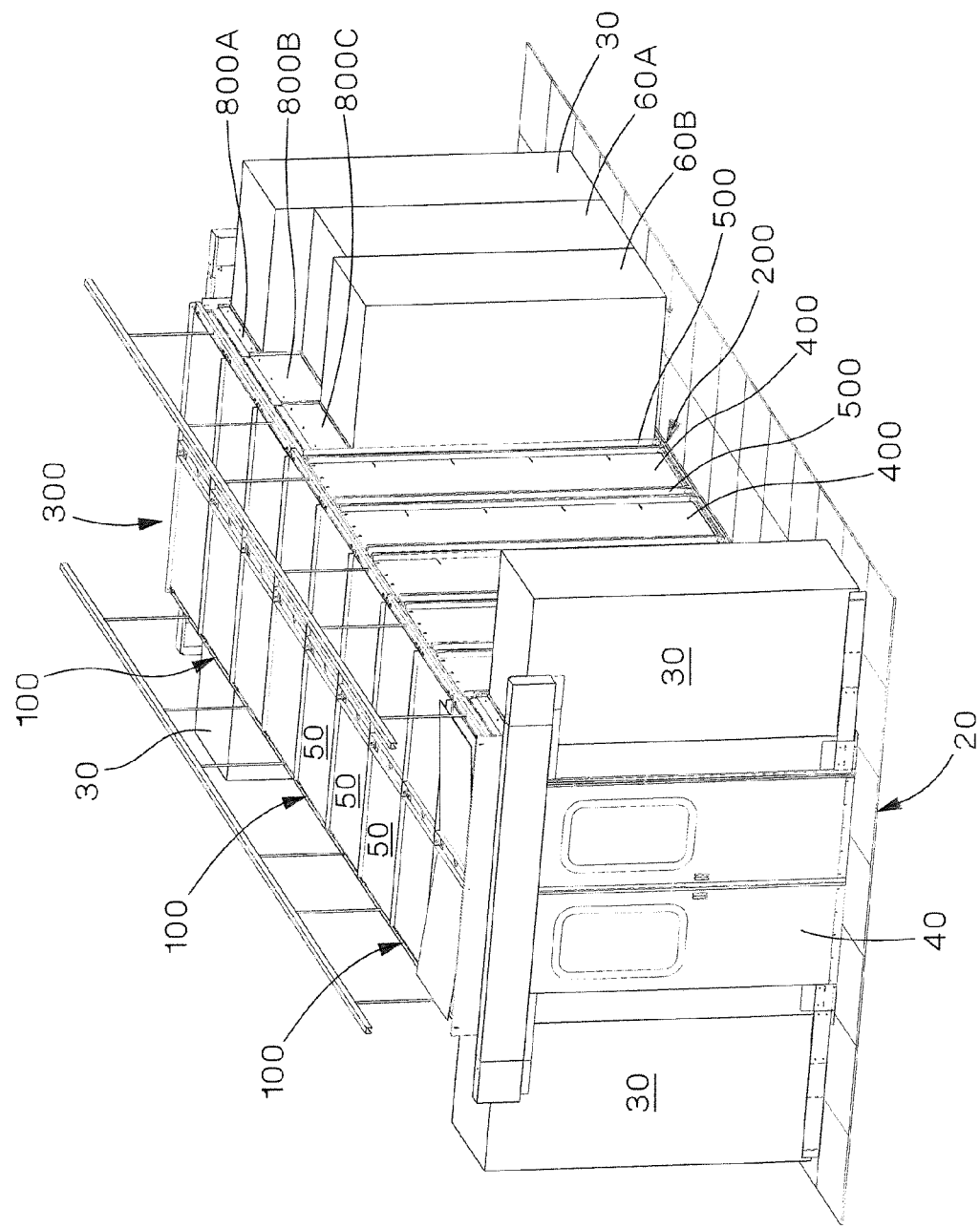
FIG. 27 is a side perspective view of an exemplary cold aisle containment system installed with a plurality of different size cabinets.

Referring to FIG. 27, a fully installed containment system 10 with a pair of different sized cabinets 60A, 60B installed is shown and illustrates how the containment system 10 can grow with the needs of a customer. It is adaptable enough to allow a wide variety of cabinets 60 to be installed at any time during the life of the containment system 10.

While this invention has been described in conjunction with the exemplary embodiments outlined above, various alternatives, modification, variations, and/or improvements, whether known or presently unforeseen, may become apparent. Accordingly, the exemplary embodiments of the invention as set forth above are intended to be illustrative, not limiting. Various changes may be made without departing from the spirit and scope of the invention.

The invention claimed is:

1. An aisle containment system, comprising:
   a pair of wall beams suspended from and spaced apart from a grid system of a ceiling;
   a pair of floor tracks positioned beneath the wall beams and secured to a floor;
   a ceiling tile support system connected to the wall beams and spaced apart from the grid system of the ceiling;
   at least one blanking panel secured to one of the wall beams and one of the floor tracks;
   a plurality of cabinets positioned at corners of the aisle containment system; and
   at least one end of row door positioned at an end of the aisle containment system and supported by at least two of the plurality of cabinets.

2. The aisle containment system of claim 1, wherein the wall beams are suspended from the ceiling by threaded rods.

3. The aisle containment system of claim 1, wherein the wall beams comprise a series of posts extending from a top wall of the wall beams.

4. The aisle containment system of claim 3, wherein the posts align and connect a cross aisle tee beam of the ceiling tile support system to the wall beam.

5. The aisle containment system of claim 3, wherein the posts align and connect a ceiling tile retainer to the wall beam.

6. The aisle containment system of claim 1, wherein the wall beams each comprise a plurality of holes formed in a front wall of the wall beams, at least one of the plurality of holes receiving a threaded member to connect the blanking panel to the wall beams.

7. The aisle containment system of claim 1, wherein the floor tracks each comprise a plurality of holes, at least one of the plurality of holes receiving a threaded member to connect the blanking panel to the floor track.

8. The aisle containment system of claim 1, wherein the ceiling tile support system comprises a plurality of cross aisle beams, a plurality of center beams, and a plurality of ceiling tiles supported by the cross aisle tee beams and the center beams.

9. The aisle containment system of claim 8, wherein the cross aisle beams comprise at least one hole that engages a post extending from a top wall of the wall beams and the center beams are positioned between the cross aisle beams and comprise an aperture for securing the center beams to the cross aisle beams.

10. The aisle containment system of claim 8, wherein the center beams comprise a hole formed in a horizontal wall of the center beams, the hole receiving a fire suppression system.

11. The aisle containment system of claim 8, wherein the ceiling tile support system comprises a retention bracket that secures the ceiling tile to the center beam, and a ceiling tile retainer that secures the ceiling tile to the wall beam.

12. The aisle containment system of claim 1, wherein the at least one blanking panel comprises a main panel, a base member that engages at least one of the floor tracks, and a plurality of slots that align with holes in the wall beams to secure the at least one blanking panel to the wall beams.

13. The aisle containment system of claim 12, wherein the at least one blanking panel comprises two adjustable side panels extending from opposite sides of the main panel and adjustably secured to the main panel such that the side panels can be adjusted laterally in relation to the main panel.

14. The aisle containment system of claim 13, wherein:
   the main panel comprises slots formed in opposing sides of the main panel;
   the side panels comprise holes positioned to align with respective slots in the main panel; and
   at least one of the slots and at least one of the holes receive a threaded member to adjustably secure the side panels to the main panel.

15. The aisle containment system of claim 13, wherein the side panels each comprise a seal positioned on an outer side of the side panel to provide a seal between the side panel and an adjacent panel or cabinet.

16. The aisle containment system of claim 1, further comprising a floor skirt secured to at least one of the pair of floor tracks, the floor skirt comprising rigid base member secured to the at least one of the floor tracks and a flexible seal secured to the rigid base member to seal against the blanking panel.

17. The aisle containment system of claim 1, further comprising an upper sealing bracket secured to at least one of the pair of wall beams, the upper sealing bracket comprising a rigid bracket secured to the at least one of the wall beams and a flexible seal secured to the rigid bracket to seal against the blanking panel.

18. The aisle containment system of claim 1, further comprising an above cabinet blanking panel secured to one of the pair of wall beams.

19. The aisle containment system of claim 18, wherein the above cabinet blanking panel comprises:
   an upper panel comprising a set of horizontal slots formed in an upper portion of the upper panel and a set of vertical slots formed in a lower portion of the upper panel; and
   a lower panel comprising holes positioned to align with respective vertical slots in the upper panel; wherein
   at least one of the vertical slots and at least one of the holes receive a threaded member to adjustably secure the upper panel to the lower panel.

20. The aisle containment system of claim 19, further comprising a first foam seal secured to a bottom edge of the lower panel and a second foam seal secured to a side edge of the lower panel.

21. A method of installing an aisle containment system, comprising the steps of:
   securing a pair of floor tracks to a floor;
   positioning a pair of wall beams above the floor tracks and spaced apart from a grid system of a ceiling and suspending the wall beams from the grid system of the ceiling;
   connecting a ceiling tile support system to the wall beams and spacing the ceiling tile support system from the grid system of the ceiling;
   positioning a cabinet at each corner of the aisle containment system;
   securing at least one blanking panel to one of the wall beams and one of the floor tracks; and
   positioning at least one end of row door at an end of the aisle containment system and securing the at least one end of row door to two of the cabinets.

22. The method of claim 21, further comprising the step of securing an above cabinet blanking panel to one of the wall beams above an undersized cabinet.

23. The method of claim 22, wherein:
   the above cabinet blanking panel comprises an upper panel comprising a set of horizontal slots formed in an upper portion of the upper panel and a set of vertical slots formed in a lower portion of the upper panel and a lower panel comprising holes positioned to align with respective vertical slots in the upper panel; and
   a height of the above cabinet blanking panel is adjusted by positioning the lower panel such that is seals against the cabinet and inserting a threaded member through the vertical slots and threading the threaded member into holes.

24. The method of claim 21, wherein the wall beams are suspended from the ceiling by threaded rods.

25. The method of claim 21, wherein the ceiling tile support system comprises a plurality of cross aisle beams, a plurality of center beams, and a plurality of ceiling tiles supported by the cross aisle beams and the center beams.

26. The method of claim 25, wherein the step of connecting the ceiling tile support system comprises inserting a post extending from a top wall of the wall beams through at least one hole formed in one of the cross aisle beams.

27. The method of claim 25, wherein the step of connecting the ceiling tile support system further comprises positioning one of the center beams between two of the cross aisle beams.

28. The method of claim 27, further comprising inserting a threaded member through an aperture formed in the center beam and an aperture formed in one of the cross aisle beams to secure the center beam to the cross aisle beam.

29. The method of claim 25, wherein the center beams comprise a hole formed in a horizontal wall of the center beams, the hole receiving a fire suppression system.

30. The method of claim 25, wherein the ceiling tiles are positioned between and supported by the cross aisle beams, the center beams, and the wall beams.

31. The method of claim 25, wherein the ceiling tiles are secured to the center beams by a retention bracket and are secured to the wall beams by a ceiling tile retainer.

32. The method of claim 31, wherein the ceiling tile retainer is secured to a wall beam by inserting a post extending from a top wall of the wall beam through at least one hole formed in the ceiling tile retainer.

33. The method of claim 31, wherein the ceiling tile retainer is secured to a wall beam by inserting a threaded member through a slot formed in the ceiling tile retainer and threading the threaded member into a hole formed in the wall beam.

34. The method of claim 21, wherein:
   the at least one blanking panel comprises a main panel, a base member engaging the floor tracks, and a plurality of slots, at least one of the plurality of slots aligning with holes in the wall beams; and
   the step of securing the at least one blanking panel comprises inserting a threaded member through the at least one of the plurality of slots and threading the threaded member into a hole formed in the wall beam and inserting a threaded member through a slot formed in the base member and threading the threaded member into a hole formed in the floor track.

35. The method of claim 34, wherein the at least one blanking panel further comprises two adjustable side panels extending from opposite sides of the main panel and adjustably secured to the main panel such that the side panels can be adjusted laterally in relation to the main panel.

36. The method of claim 35, wherein the side panels each comprise a seal positioned on an outer side of the side panel to provide a seal between the side panel and an adjacent panel or cabinet.

37. The method of claim 21, further comprising the step of securing a floor skirt to the floor track, the floor skirt comprising rigid base member secured to the floor track and a flexible seal secured to the rigid base member and sealed against the blanking panel.

38. The method of claim 21, further comprising securing an upper sealing bracket to the wall beam, the upper sealing bracket comprising a rigid bracket secured to the wall beam and a flexible seal secured to the rigid bracket and sealed against the blanking panel.

* * * * *